United States Patent
Frydman et al.

(10) Patent No.: US 10,794,980 B2
(45) Date of Patent: Oct. 6, 2020

(54) CROSS-TERM SPATIOTEMPORAL ENCODING FOR MAGNETIC RESONANCE IMAGING

(71) Applicant: YEDA RESEARCH AND DEVELOPMENT CO. LTD., Rehovot (IL)

(72) Inventors: Lucio Frydman, Rehovot (IL); Zhiyong Zhang, Rehovot (IL); Shimon Michael Lustig, Moraga, CA (US)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 339 days.

(21) Appl. No.: 15/749,518

(22) Filed: Feb. 1, 2018

(65) Prior Publication Data

US 2020/0110144 A1    Apr. 9, 2020

Related U.S. Application Data

(63) Continuation-in-part of application No. PCT/IL2016/050850, filed on Aug. 4, 2016.
(Continued)

(51) Int. Cl.
    *G01R 33/56* (2006.01)
    *G01R 33/561* (2006.01)
    *G01R 33/54* (2006.01)

(52) U.S. Cl.
    CPC ....... *G01R 33/5616* (2013.01); *G01R 33/543* (2013.01)

(58) Field of Classification Search
    CPC .......... G01R 33/20; G01V 3/32; A61B 5/055; G01N 24/00
(Continued)

(56) References Cited

U.S. PATENT DOCUMENTS 6,873,153 B2   3/2005   Frydman
7,944,206 B2   5/2011   Frydman et al.
(Continued)

FOREIGN PATENT DOCUMENTS

WO    WO 2004/011899 A2    2/2004
WO    WO 2014203253 A1    12/2014

OTHER PUBLICATIONS

Ben-Eliezer et al. "High-definition, single-scan 2D MRI in inhomogeneous fields using spatial encoding methods" Magnetic resonance imaging. Jan. 1, 2010;28(1):77-86.
(Continued)

*Primary Examiner* — Giovanni Astacio-Oquendo
(74) *Attorney, Agent, or Firm* — Mark S. Cohen; Pearl Cohen Zedek Latzer Baratz LLP

(57) ABSTRACT

A method for MRI imaging of a subject includes spatially encoding spins in a slice of the subject in orthogonal first and second directions. The encoding includes applying a chirped radiofrequency (RF) pulse concurrently with application of a magnetic field gradient pulse along the first direction. After applying of the RF pulse, a second chirped RF pulse is applied concurrently with application of a second magnetic field gradient pulse, with polarity opposite that of the first gradient pulse. An encoding magnetic field gradient, constant from applying the first RF pulse until the end of applying the second RF pulse, is concurrently applied along the second direction. Following the encoding, a spin signal is measured concurrently with application of a constant readout magnetic field gradient.

20 Claims, 13 Drawing Sheets

Related U.S. Application Data

(60) Provisional application No. 62/200,667, filed on Aug. 4, 2015.

(58) Field of Classification Search
USPC .................. 324/200, 300, 301, 307, 309
See application file for complete search history.

(56) References Cited

U.S. PATENT DOCUMENTS

| | | | | |
|---|---|---|---|---|
| 7,949,372 B2* | 5/2011 | Lee | ............... | H04B 3/58 |
| | | | | 455/41.2 |
| 9,991,716 B2* | 6/2018 | Cutright | ............... | G05B 19/048 |
| 9,992,855 B2* | 6/2018 | Larroux | ............... | H05G 1/58 |
| 2003/0043027 A1* | 3/2003 | Carson | ............... | H04B 3/54 |
| | | | | 375/259 |
| 2014/0205026 A1* | 7/2014 | Smaini | ............... | H04B 3/54 |
| | | | | 375/257 |
| 2017/0319097 A1* | 11/2017 | Amthor | ............... | A61B 5/055 |

OTHER PUBLICATIONS

International Search Report for PCT Application No. PCT/IL2016/050850 dated Jan. 24, 2017.

Seginer et al. "Referenceless reconstruction of spatiot mporally encoded imaging data: principles and applications to real-time MRI" Magnetic resonance in medicine. Dec. 2014;72(6):1687-95.

Tal et al. "A continuous phase-modulated approach to spatial encoding in ultrafast 2D NMR spectroscopy" Journal of Magnetic Resonance. Sep. 1, 2005;176(1):107-14.

Zhang et al. "Single-scan MRI with exceptional resilience to field heterogeneities" Magnetic resonance in medicine. Feb. 2017;77(2):623-34.

* cited by examiner

CROSS-TERM SPATIOTEMPORAL ENCODING FOR MAGNETIC RESONANCE IMAGING

CROSS REFERENCE TO RELATED APPLICATIONS

The present invention is a continuation in part of International Application No. PCT/IL2016/050850, filed on Aug. 4, 2016 and published as International Publication Number WO 2017/021967 on Feb. 9, 2017, and which claims the priority benefit of U.S. provisional patent application No. 62/200,667 filed on Aug. 4, 2015, all of which are incorporated in their entirety herein by reference.

FIELD OF THE INVENTION

The present invention relates to magnetic resonance imaging.

BACKGROUND OF THE INVENTION

Nuclear magnetic resonance (NMR) finds its widest contemporary application within the context of magnetic resonance imaging (MRI). MRI measurements and experiments traditionally retrieve the multidimensional spin density $\rho(r)$. The multidimensional spin density is measured by acquisition of a free induction decay (FID) signal that is collected under the action of linear field gradients $G=(G_x, G_y, G_z)$ acting along orthogonal axes. Gradients drive the evolution of spins in a reciprocal space $k(t)=\gamma \int_0^t G(t')dt'$. The multidimensional spin density may be extracted from the resulting signal $$S(k) = \int_{\text{volume } r} \rho(r) \exp(ik \cdot r) dr$$

by application of a Fourier transformation (FT).

Techniques for rapid MRI have been developed in order to enable imaging of transient phenomena in the body, or to reduce or eliminate effects of motion of the body or of an organ on the resulting image. Each technique may be implemented by application of an appropriate sequence of gradients and radiofrequency (RE) pulses.

A variety of techniques have been proposed for sampling the k-domain in a manner that enables rapid image acquisition. For example, in echo-planar imaging (EPI), ultrafast imaging is achieved using oscillating field gradients to monitor sizable k-space volumes in a single shot. EPI is capable of producing two-dimensional MRI images at a rate that is typical of video frames. Thus, EPI has been widely applied to research and clinical applications such as functional MRI, diffusion-weighted studies, and tractography. EPI has been applied in both preclinical and human settings.

During recent years, an alternative ultrafast method has been described based on spatiotemporal encoding (SPEN) of the spin interactions. In SPEN, one dimension is scanned in real space. A combination of linearly swept RF pulses is applied concurrently with an encoding pulse. As a result, the phase shift of the acquired signal varies quadratically with position along one of the axes. Thus, an appreciable signal is acquired only from near the position of minimum phase, where the phase is slowly varying. Application of an acquisition gradient along the axis may sweep the position of minimum along the axis, thus sequentially acquiring signals from different positions along the axis as a function of time.

In a one dimensional example, a field gradient may be applied to spread out resonance frequencies along an r axis to be imaged, together with a frequency-incremented excitation or inversion radiofrequency (RF) pulse. Assuming, for example, application of a linearly-swept inversion RF pulse of duration $T_p$ acting while in the presence of an encoding gradient $G_{enc}$ and targeting a field-of-view (FOV), a quadratic spatial encoding is imposed on the phases of nuclear spins (each having gyromagnetic ratio $\gamma$) described by $$\phi_{enc}(r) = \left(\frac{\gamma G_{enc} T_p}{FOV}\right) r^2 + \text{const},$$

where for simplicity, chemical- or susceptibility-derived offsets are ignored. Given this dependence, and for the condition $\gamma G_{enc} T_p / FOV \gg 1$, the sole contributors to the observable signal arise from spins positioned near the stationary point $r=0$. For all other positions, the rapidly varying phase leads to destructive interference among neighboring contributions, thus nullifying the resulting detectable signal. SPEN images may thus be read out following the application of a suitable pre-phasing gradient of area $k_{pre}$ that initially shifts the stationary point to one end of the FOV. Thereafter, signals are detected during application of an acquisition gradient $G_{acq}$ applied along the same r axis, causing the stationary point to move along that axis. Assuming for simplicity a constant $G_{acq}$, the resulting F(t) signal S(t) will then reflect solely those points $r_0$ that fulfill the so-called stationary phase condition:

$$\left[\frac{\partial(\phi_{enc}(r) + (k_{pre} + \gamma G_{acq} t) \cdot r)}{\partial r}\right]_{r=r_0(t)} = 0.$$

Hybrid SPEN may be applied to acquire two dimensional images. In hybrid SPEN, an orthogonal axis is encoded by the action of a second, oscillating readout gradient using conventional k-space sampling concepts.

Thus, in SPEN, the signal in one of the dimensions is acquired in real space as a function of time, without application of a FT. As a result, the images formed have been found to be less sensitive to various homogeneities than images that were acquired by application of EPI. These inhomogeneities may include inhomogeneities that result from the magnets themselves, or that result from variations in magnetic susceptibility and chemically-derived frequency offsets in the vicinity of imaged tissue.

Other techniques of ultrafast two-dimensional NMR involves application of an initial spin excitation followed by the action of two frequency-swept inversion pulses acting in unison with a pair of bipolar gradients. These manipulations result in a bilinear phase encoding that is proportional to both the chemical shifts $\Omega_1$ of targeted sites as well as to their positions.

SUMMARY OF THE INVENTION

There is thus provided, in accordance with an embodiment of the present invention, a method for MRI imaging of a subject, the method including: spatially encoding spins in a slice of the subject in a first direction and in a second direction that is orthogonal to the first direction by applying a first chirped radiofrequency (RF) pulse concurrently with application of a first magnetic field gradient pulse along the first direction, after the applying of the first RF pulse, applying a second chirped RF pulse concurrently with application of a second magnetic field gradient pulse along the first direction, the second gradient pulse having a polarity that is opposite to a polarity of the first gradient pulse, and concurrently applying an encoding magnetic field gradient along the second direction, the encoding gradient being constant at least from the beginning of the applying of the first RF pulse until the end of the applying of the second RF pulse; and following the encoding of the spins, measuring a spin signal concurrently with application of a constant readout magnetic field gradient.

Furthermore, in accordance with an embodiment of the present invention, the readout gradient is applied along the second direction.

Furthermore, in accordance with an embodiment of the present invention, the encoding gradient and the readout gradient form a single continuous gradient along the second direction.

Furthermore, in accordance with an embodiment of the present invention, the second RF pulse is applied after a delay following the applying of the first RF pulse.

Furthermore, in accordance with an embodiment of the present invention, a length of the delay is selected so as to cause the measuring of the spin signal to cover a selected field of view.

Furthermore, in accordance with an embodiment of the present invention, the length of the delay is equal to half a length of a slice selection RF pulse that is applied prior to the applying of the first RF pulse plus half of a time period during which the spin signal is measured.

Furthermore, in accordance with an embodiment of the present invention, the method includes applying an oscillating magnetic field gradient concurrently with the measuring of the spin signal, and along a third direction that is orthogonal to the first direction and to the second direction.

Furthermore, in accordance with an embodiment of the present invention, the method includes applying a magnetic gradient pulse along the third direction during a delay between the applying of the first RF pulse and the applying of the second RF pulse.

Furthermore, in accordance with an embodiment of the present invention, the second RF pulse is substantially identical to the first RF pulse.

Furthermore, in accordance with an embodiment of the present invention, the first RF pulse or the second RF pulse is a swept $\pi/2$ or $\pi$ pulse.

Furthermore, in accordance with an embodiment of the present invention, the strength of the second gradient pulse is different from the strength of the first gradient pulse.

Furthermore, in accordance with an embodiment of the present invention, the method includes a period during which no RF pulses or field gradients are applied between application of the first RF pulse and the second RF pulse.

Furthermore, in accordance with an embodiment of the present invention, the method includes applying, during multiple scans and between application of the first RF pulse and the second RF pulse, a variable gradient whose strength varies from scan to scan of the multiple scans.

Furthermore, in accordance with an embodiment of the present invention, the method includes periodically skipping sampling along a phase-encoding or direct readout axis in reciprocal space.

There is further provided, in accordance with an embodiment of the present invention, a magnetic resonance imaging system for imaging a subject, the system including: a magnet system that is controllable to generate magnetic field gradients along a plurality of axes; an RF system that is controllable to generate an RF pulse and to measure an RF signal; and a processor that is configured to operate in accordance with programmed instructions to execute a method that includes: spatially encoding spins in a slice of a subject in a first direction and in a second direction that is orthogonal to the first direction by controlling the RF system to apply a first chirped radiofrequency (RF) pulse concurrently with controlling the magnet system to apply a first magnetic field gradient pulse along the first direction, after application of the first RF pulse, controlling the RF system to apply a second chirped RF pulse concurrently with controlling the magnet system to apply of a second magnetic field gradient pulse along the first direction, the second gradient pulse having a polarity that is opposite to a polarity of the first gradient pulse, and concurrently controlling the magnet system to apply an encoding magnetic field gradient along the second direction, the encoding gradient being constant at least from the beginning of the applying of the first RF pulse until the end of the applying of the second RF pulse; and following the encoding of the spins, controlling the RF system to measure a spin signal concurrently with controlling the magnet system to apply a constant readout magnetic field gradient.

Furthermore, in accordance with an embodiment of the present invention, the readout gradient is applied along the second direction.

Furthermore, in accordance with an embodiment of the present invention, the encoding gradient and the readout gradient form a single continuous gradient along the second direction.

Furthermore, in accordance with an embodiment of the present invention, the second RF pulse is applied after a delay following the applying of the first RF pulse, the length of the delay being selected so as to cause the measuring of the spin signal to cover a selected field of view.

Furthermore, in accordance with an embodiment of the present invention, the length of the delay is equal to half a length of a slice selection RF pulse that is applied prior to the applying of the first RF pulse plus half of a time period during which the spin signal is measured.

Furthermore, in accordance with an embodiment of the present invention, the processor is configured to execute a method that includes controlling the magnet system to apply an oscillating magnetic field gradient concurrently with the measurement of the spin signal, and along a third direction that is orthogonal to the first direction and to the second direction.

Furthermore, in accordance with an embodiment of the present invention, the processor is configured to execute a method that includes controlling the magnet system to apply a magnetic gradient pulse along the third direction during a delay between the applying of the first RF pulse and the applying of the second RF pulse.

Furthermore, in accordance with an embodiment of the present invention, the second RF pulse is substantially identical to the first RF pulse.

Furthermore, in accordance with an embodiment of the present invention, the first RF pulse or the second RF pulse is a swept $\pi/2$ or $\pi$ pulses.

BRIEF DESCRIPTION OF THE DRAWINGS

In order for the present invention to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

Figure 1:
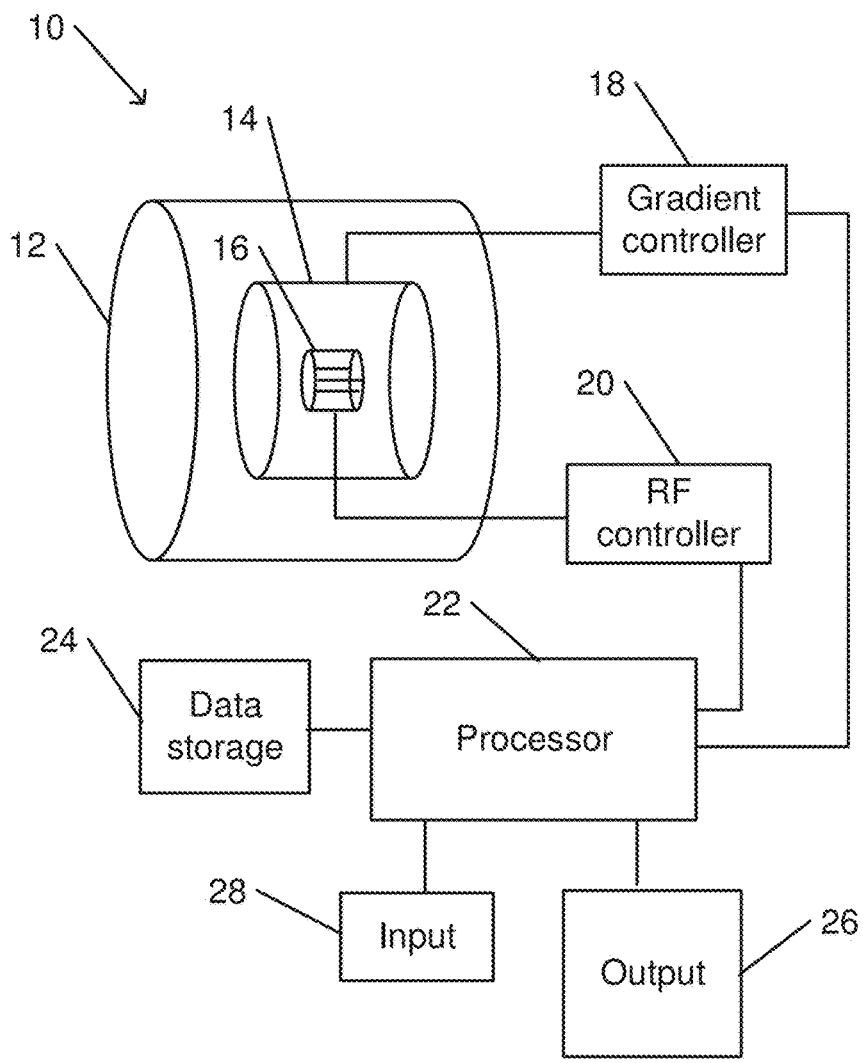
FIG. 1 is a schematic illustration of an MRI system for application of cross-term spatiotemporal encoding (xSPEN), in accordance with an embodiment of the present invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, us of the conjunction "or" as used herein is to be understood as inclusive (any or all of the stated options).

Some embodiments of the invention may include an article such as a computer or processor readable medium, or a computer or processor non-transitory storage medium, such as for example a memory, a disk drive, or a USB flash memory, encoding, including or storing instructions, e.g., computer-executable instructions, which when executed by a processor or controller, carry out methods disclosed herein.

In accordance with an embodiment of the present invention, magnetic resonance imaging (MRI) images are acquired by application of cross-term spatiotemporal encoding (xSPEN).

In xSPEN, spatial encoding is applied concurrently along two orthogonal axes within a selected slice. Two (or more) frequency-swept RF pulses are applied to a selected slice, concurrently with application of a bipolar encoding gradient along one of the two orthogonal axes, and a constant encoding gradient along the other of the axes. A spin signal is measured concurrently with application of a constant acquisition gradient along on or both of the orthogonal axes.

FIG. 1 is a schematic illustration of an MRI system for application of xSPEN, in accordance with an embodiment of the present invention.

MRI system 10 includes a main magnet 12. Main magnet 12 may include one or more permanent, resistive, or superconducting magnets that are configured to provide a uniform magnetic field in bore into which a subject to be imaged is placed.

Gradient magnet system 14 typically includes electromagnets that may be controlled by gradient controller 16 to generate magnetic field gradients, typically along one or more of three orthogonal spatial axes.

A radiofrequency system of MRI system 10 includes at least a radiofrequency coil 16 that is operated by RF controller 20. For example, RF controller 20 may operate radiofrequency coil 16 to generate radiofrequency electromagnetic fields. RF controller 20 may also operate radiofrequency coil 16 as a receiver to detect and measure electromagnetic fields that are generated by nuclear spins within the subject.

Gradient magnet system 14 and gradient controller 16 may be operated in cooperation with radiofrequency coil 16 and RF controller 20 to attain spatial encoding by performing operations on the spins at particular locations within the gradient fields.

Operation of gradient controller 16 and of RF controller 20 may be controlled and coordinated by processor 22.

For example, processor 22 may include one or more processing units, e.g. of one or more computers, that are configured to operate in accordance with stored programmed instructions. Processor 22 may be configured to control operation of gradient controller 16 and of RF controller 20 during MRI data acquisition, to process and analyzed the acquired data, and to prepare and generate an MRI image on the basis of the processing and analysis of the data.

Processor 22 may communicate with output device 26. For example, output device 26 may include a computer monitor or screen. For example, processor 22 may communicate with a screen of output device 26 to display an MRI image, parameters or protocols used in acquiring MRI data or for generating or displaying the MRI image, or other relevant data. In another example, output device 26 may include a printer, display panel, speaker, or another device capable of producing visible, audible, or tactile output.

Processor 22 may communicate with input device 28. For example, input device 16 may include one or more of a keyboard, keypad, or pointing device for enabling a user to inputting data or instructions for operation of processor 22. For example, an operator of MRI system 10 may operate input device 16 to select a scanning protocol for data acquisition, to begin or halt scanning, to control generation of MRI images, and to control display of MRI images Processor 22 may communicate with data storage device 24. Data storage device 24 may include one or more fixed or removable volatile (e.g., a computer memory) or nonvolatile data storage devices. For example, data storage device 20 may be used to store programmed instructions for operation of processor 22, parameters for use during operation of processor 22, and results of operation of processor 22.

Figure 2:
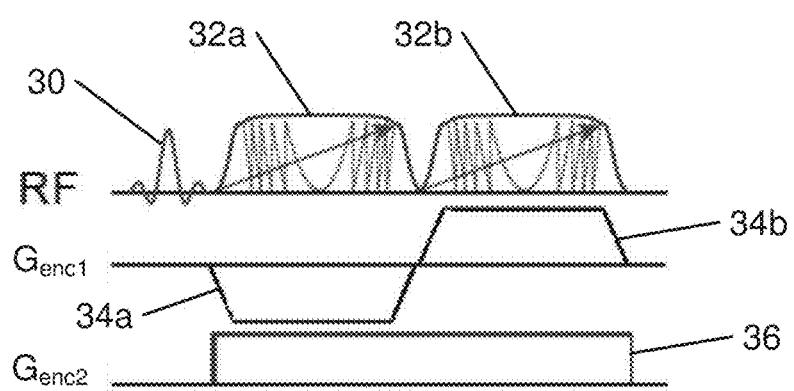
FIG. 2 schematically illustrates an example of a sequence for position encoding in application of xSPEN, in accordance with an embodiment of the present invention.

FIG. 2 schematically illustrates an example of a sequence for position encoding in application of xSPEN, in accordance with an embodiment of the present invention. The example shown is one of several sequences that may be applied to yield position encoding in implementing xSPEN (e.g., as shown in FIGS. 6A-6D). For convenience, physical principles of xSPEN are herein illustrated with reference to the sequence shown in FIG. 2.

For example, the orthogonal axes for application of encoding gradients may be designated $r_1$ and $r_2$. For example, $r_1$ and $r_2$ may represent Cartesian axes (e.g., x, y, and z) that are associated with the MRI scanner or with anatomical planes of the subject. The selection of axes $r_1$ and $r_2$ may be determined by the geometry of a subject or of a slice that is to be imaged.

The horizontal axes in FIG. 2 represent time. Slice selection RF pulse 30 may be first generated to select a slice for imaging. Alternatively, multi-slice operation may be possible, as well as simultaneous acquisition of images of multiple slices by utilizing multi-band excitation and parallel receiving technologies.

Frequency-swept RF pulses 32a and 32b are applied sequentially. (Frequency-swept RF pulses may also be referred to as chirped and/or adiabatic pulses.)

A bipolar encoding gradient $Genc_1$ may be applied along one of the axes. For example, encoding gradient pulses 34a and 34b may be applied along axis $r_1$. Encoding gradient pulse 34a may be applied concurrently with frequency-swept RF pulse 32a. Encoding gradient pulse 34b, of polarity opposite that of encoding gradient pulse 34a, is applied concurrently with frequency-swept RF pulse 32b.

Concurrently with application of encoding gradient pulses 34a and 34b, constant encoding gradient 36 ($Genc_2$) may be applied along axis $r_2$. The gradient acting along axis $r_2$ is orthogonal to the one acting along $r_1$ in the mathematical sense of yielding a Kronecker delta function when the product of these gradients is integrated over the analyzed sample volume.

The concurrent application of $Genc_1(r_1)$ and $Genc_2(r_2)$ results in a spatial phase with a hyperbolic dependence $\phi_{enc}(r_1,r_2)=Cr_1r_2+\phi_0$, where C represents a controllable spatiotemporal constant (e.g., controllable by adjusting factors such as pulse duration, chirp bandwidth of the RF pulses, gradient strength, or other controllable factors) and $\phi_0$ represents a phase shift that is not position dependent. The hyperbolic dependence of $\phi_{enc}$ is a function of a produce of two different spatial variables, namely the product $r_1r_2$, and is therefore referred to herein as cross-term spatiotemporal encoding (xSPEN).

In a region that surrounds a stationary point of the hyperbolic phase profile, where the condition $$\frac{\partial \phi_{enc}}{\partial r_1} = \frac{\partial \phi_{enc}}{\partial r_2} = 0$$

is met, the spin phases vary slowly with position. With increased distance from the stationary point, the variation of spin phase with position is increasingly rapid. Thus, only spins that are positioned near the stationary point significantly contribute to the measured signal. For all other positions, the rapidly varying phase leads to destructive interference among neighboring contributions. Therefore, spins in those other positions do not contribute appreciably to the measured signal.

Following the concurrent application of the encoding gradients and the frequency-swept RF pulses, a constant acquisition gradient $G_{acq}$ may be applied along, $r_1$, $r_2$, or both. Application of the acquisition gradient causes shifting of the stationary point with time. Thus, the measured signals from successive points within the selected slice may be measured sequentially. Signals in xSPEN may be acquired following the application of a suitable pre-phasing gradient of area $k_{pre}$ that initially shifts the stationary point to one end of the FOV. Thereafter, signals are detected during application of the constant acquisition gradient $G_{acq}$ so as to cause the stationary point to move along an axis within the slice.

The symmetry of the encoding vis-á-vis two spatial axes provides a number of different acquisition scenarios.

Figure 3A:
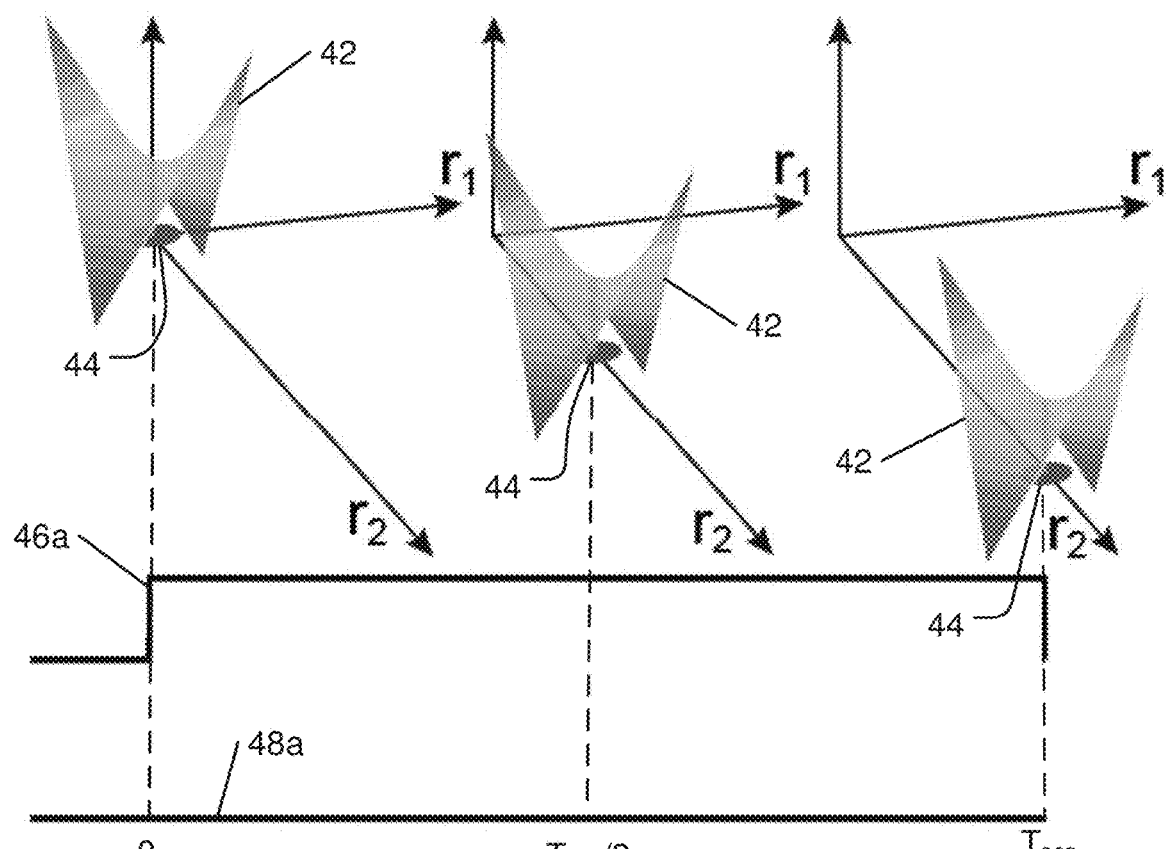
FIG. 3A schematically illustrates a sequence for data acquisition in application of xSPEN, the acquisition gradient being applied along an axis along which a bipolar encoding gradient was applied during the position encoding illustrated in FIG. 2.

FIG. 3A schematically illustrates a sequence for data acquisition in application of xSPEN, the acquisition gradient being applied along an axis along which a bipolar encoding gradient was applied during the position encoding illustrated in FIG. 2. In the three-dimensional graphs of FIG. 3A (and of FIGS. 3B and 3C), the horizontal axes represent axes $r_1$ and $r_2$, and the vertical axis represents spin phase.

In FIG. 3A, constant $r_1$ acquisition gradient 46a ($G_{acq}^1$) is applied only along the $r_1$ axis between time 0 and time $T_a$, along which $G_{enc1}$ had been previously applied (FIG. 2). No acquisition gradient is applied during that time period along the $r_2$ axis, as represented by zero $r_2$ gradient 48a. In this case, successive sampling may acquire signals from successive points along the $r_2$ axis, within a projection along the $r_1$ axis that depends on the width subtended along the $r_1$ axis by hyperbolic phase dependence 42. The applied $G_{acq}^1(f_1)$ results in an observable signal only when the condition $$\left[\frac{\partial(\phi_{enc}(r_1, r_2) + (k_{pre} + \gamma G_{acq}^1 t) \cdot r_1)}{\partial r_1}\right] = 0$$

is met at stationary point region 44 of hyperbolic phase dependence 42. This results in rasterization along the $r_2$ axis that is described by $$(r_2)_0(t) = -\frac{k_{pre}}{C} - \frac{\gamma G_{acq}^1}{C}t.$$

Thus hyperbolic phase dependence 42 and stationary point region 44 move along the $r_2$ axis as a function of time.

Figure 3B:
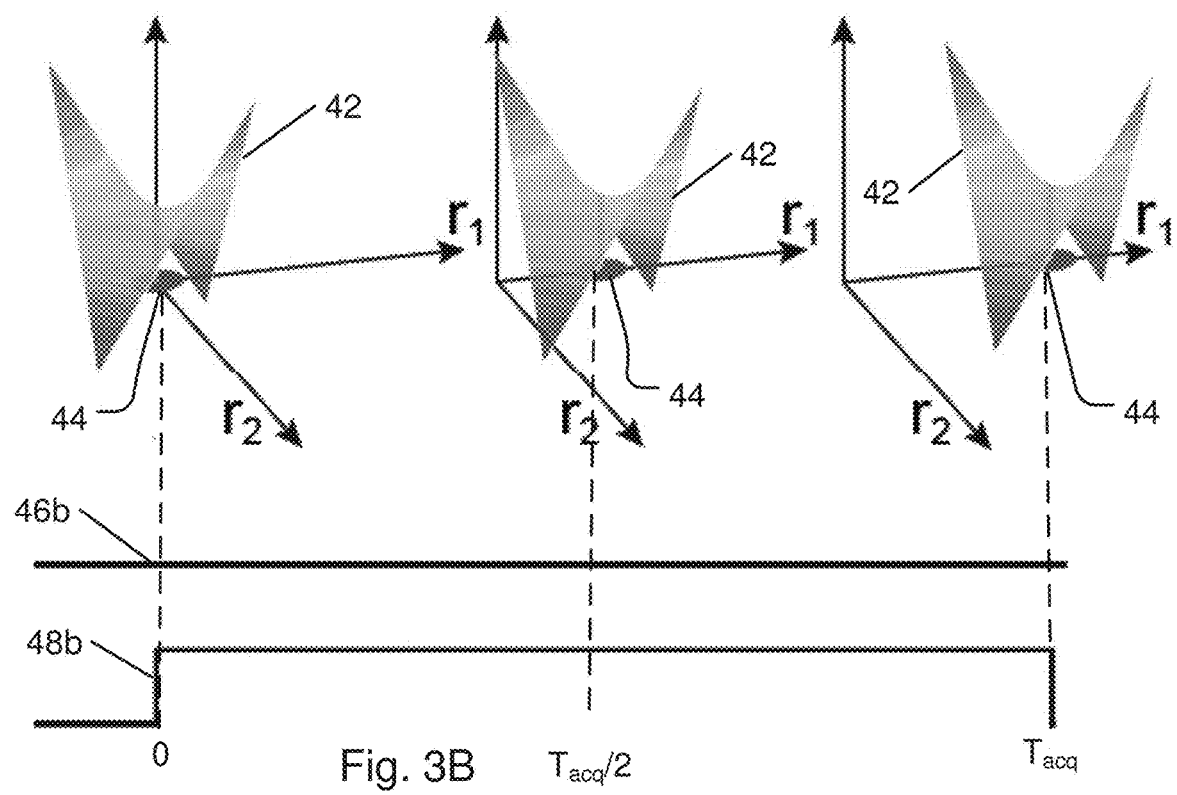
FIG. 3B schematically illustrates a sequence for data acquisition in application of xSPEN, the acquisition gradient being applied along an axis along which a constant encoding gradient was applied during the position encoding illustrated in FIG. 2.

FIG. 3B schematically illustrates a sequence for data acquisition in application of xSPEN, the acquisition gradient being applied along an axis along which a constant encoding gradient was applied during the position encoding illustrated in FIG. 2. This sequence has been demonstrated to result in images whose quality is not significantly degraded under the influence of field and frequency heterogeneities In FIG. 3B, constant $r_2$ acquisition gradient 48b ($G_{acq}^2$) is applied only along the $r_2$ axis between time 0 and time $T_a$. No acquisition gradient is applied during that time period along the $r_1$ axis, as represented by zero $r_1$ gradient 46b. In this case, successive sampling may acquire signals from successive points along the $r_1$ axis. The applied $G_{acq}^2(r_2)$ results in an observable signal only when the condition $$\left[\frac{\partial(\phi_{enc}(r_1, r_2) + (k_{pre} + G_{acq}^2 t) \cdot r_2)}{\partial r_2}\right] = 0$$

is met at stationary point region 44 of hyperbolic phase dependence 42. This results in rasterization along the $r_1$ axis that is described by $$(r_1)_0(t) = -\frac{k_{pre}}{C} - \frac{\gamma G_{acq}^2}{C}t.$$

Thus hyperbolic phase dependence 42 and stationary point region 44 move along the $r_2$ axis as a function of time.

As another possibility, acquisition gradients $G_{acq}^1(t)$ and $G_{acq}^2(t)$ may be applied concurrently to rasterize along a selectable (e.g., by selection of relative strengths of $G_{acq}^1(t)$ and $G_{acq}^2(t)$ path in the ($r_1$, $r_2$) plane.

It may be noted that a mapping of spin density $\rho(r_1)$ may be measured by performing the xSPEN encoding illustrated in FIG. 2 followed by execution of the acquisition illustrated in FIG. 3B. If constant encoding gradient 36 (Genc$_2$) is substantially equal and coaxial with acquisition gradient 48b ($G_{acq}^2$), then the gradient along the $r_2$ axis may be left on continuously during encoding and acquisition. However, some modifications may be made in order to enable selection of an imaged slice.

Figure 4:
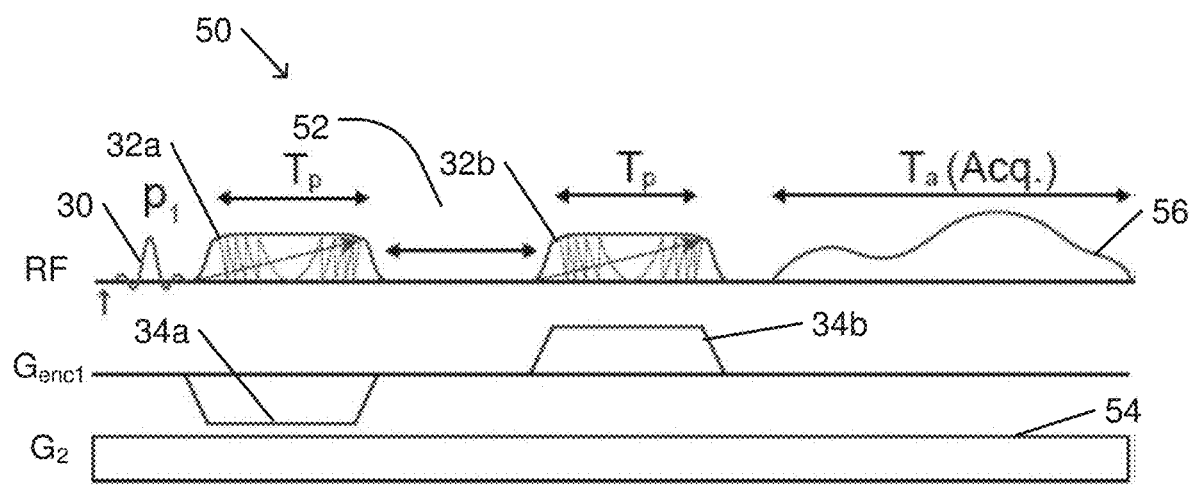
FIG. 4 schematically illustrates integration of the sequences shown FIGS. 2 and 3B for one dimensional imaging of a field of view.

FIG. 4 schematically illustrates integration of the sequences shown FIGS. 2 and 3B for one dimensional imaging of a field of view.

In sequence 50, slice selection RF pulse 30 is of duration $p_1$ and signal data 56 is acquired during a time period of length $T_a$. After application of frequency-swept RF pulse 32a and encoding gradient pulse 34a, frequency-swept RF pulse 32b and encoding gradient pulse 34b are not applied until after free evolution delay 52 of duration $(T_a+p_1)/2$. The effect is to shift the stationary point to one end of the targeted FOV, and to refocus the effects of the slice-selective pulse. For example, frequency-swept RF pulse 32a may represent 180° ($\pi$) pulses. Signal data 56 may be in the form of a convolution of the spin density with a sinc function.

Gradient 54 ($G_z$), along $r_2$, serves as both an encoding gradient and as an acquisition gradient. The strength of gradient 54 may be variable. The strength of gradient 54 may be selected to be sufficiently low such that the length of the stationary point region of the hyperbolic phase dependence along the $r_2$ axis exceeds the width of the slice selection, minimizes diffusion losses, and reduces RF power requirements.

Basic characteristics of xSPEN may be considered under idealized conditions, e.g., in the absence of field inhomogeneity, chemical shifts, or relaxation effects. In the following discussion, the $r_1$ axis corresponds to the y axis (along which the image is acquired in this one-dimensional example), and the $r_2$ axis corresponds to the z axis (along which a slice to be imaged is selected). These axes and geometries are here chosen for convenience of the description. Other axes and geometries may be used.

The phase imparted on the spins by the action of the pulses of sequence 50 plus free evolution delay 52, neglecting the refocusing of the slice-selective pulse, may under such assumption be expressed as $$\phi_{enc}(y, z) = -Cy \cdot \gamma G_z z - \gamma G_z z \cdot \frac{T_a}{2}$$

$$\text{where } C = \frac{4T_p \gamma G_y}{2\pi BW}$$

and BW is the identical chirp bandwidth of frequency-swept RF pulses 32a and 32b, with BW=($\gamma G_z L_z + \gamma G_y FOV_y$). $FOV_y$ represents the length of the targeted imaging region and $L_z$ represents a region on the order of the thickness of the slice (assumed centered at zero) over which the image (along v) is acquired. The subsequent acquisition of signal data 56 during application of gradient 54 of the same magnitude $G_z$ performs an analog Fourier transformation describable as $$S(t) \propto \int_Y \left[\int_{-L_z/2}^{L_z/2} dz \rho(y, z) \cdot e^{i\phi_{enc}(y,z)} e^{i\gamma G_z t z}\right] dy$$

Assuming for simplicity that the z-dependence of the image within the slice d all relaxation effects may be disregarded, the signal may be described by $$S(t) \propto \int_Y \left[ \int_{-L_z/2}^{L_z/2} dz \rho(y, z) \cdot e^{i\left[-Cy - \frac{T_a}{2} + t\right]\gamma G_z z} \right] dy =$$

$$\int_Y dy \rho(y) \cdot L_z \text{sinc}\left\{ [-C'y + k(t)] \cdot \frac{L_z}{2} \right\},$$

where $k(t) = \gamma G_z(t - T_a/2)$ is an acquisition wavenumber and $C' = C\gamma G_z$. Therefore, the signal collected as a function of an acquisition time $0 \leq t \leq T_a$ is the convolution of the $\rho(v)$ image being sought with a sine function at a shifting position along the y axis that is described by $$y(t) = \frac{k(t)}{C'} = \frac{\gamma G_z(t - T_a/2)}{C\gamma G_z} = \frac{2\pi BW}{4T_p \gamma G_y} \cdot (t - T_a/2).$$

The in this case is given by the sine function, the imaging resolution being defined by the half-height width of the point spread function $$\delta y = \frac{2\pi FOV_y}{T_a \cdot \gamma G_z L_z}.$$

It may be noted that the resolution may be improved by increasing the duration of the $T_p$ frequency-swept encoding pulses or by increasing $L_z$. The actual FOV may be determined by $FOV_y = |k_{max} - k_{min}|/C' = \gamma G_z T_a / C'$, where $k_{min}$ and $k_{max}$ represent the limits of the inverse space in which data is collected.

The strength of $G_2$ is not strictly constrained as it is by Nyquist criteria in other MRI techniques. Values of other properties of $G_2$ (e.g., its orientation or linearity) may also not be critical to the image acquisition process. For example, linearly broadening of the range of resonance frequencies by gradient $G_2$ may be replaced nonlinear frequency broadening (e.g., originating from field heterogeneities, by discrete isotropic chemical shift displacements, or by an intrinsic orientation-dependent magnetic anisotropy), with sequence 50 still yielding acceptable results. In this case, axis $r_2$ may not correspond with a physical axis, but may represent an intrinsic variable defining the dependence of the broadening of the range of resonance frequencies. The point spread function (PSF) may thus deviate from an idealized sine-like form without significantly affecting xSPEN's imaging capability.

Thus, if an ideal field gradient is replaced by field gradient superimposed on other sources affecting the spins' rates of precession (e.g., dispersions over multiple chemical shifts, substantial susceptibility effects, or arbitrary field-derived broadening), the appearance of the collected xSPEN image may not be significantly altered. In such cases, spins in different voxels may be excited or inverted by each of the swept RF pulses at times that do not correspond to the ideally expected time. How ever, the effects of these deviations in timing may be nullified by corresponding deviations in timing in the formation of the spatial $r_2$-echo. Thus the timing of the rasterization during the course of the acquisition may restore the signals to their original locations. This balanced voxel-by-voxel cancelation of arbitrary non-idealities in timing and in accrued phases does not require any a priori knowledge regarding the nature of the inhomogeneities or any special post-processing. Thus, MRI images that are acquired by application of xSPEN may be unaffected by very large field inhomogeneity effects.

In the above example, a pulse sequence similar to sequence 50 may be considered, where one-dimensional xSPEN MRI takes place along the y-axis and is implemented with the aid of a gradient $G_z$. The sequence begins with a z-axis slice selection (assumed centered at zero, i.e. $O_{slice} = 0$) that, as is customary, is assumed to be thin enough to enable disregarding the z-dependence of the y-axis features. Thus, the goal is to measure spin density $\rho(y)$. The assumed narrowness of this slice enables a first-order approximation of the field inhomogeneity along the z axis in which the (unknown) frequency distribution induced by spatially-dependent field heterogeneities and/or chemical shifts may be expanded as $\delta\omega(y,z) = \delta\omega(y) + \gamma g(y)z$. Here, $\delta\omega(y)$ is y-dependent frequency which may include a constant term arising from chemical shifts, y is the gyromagnetic ratio, and g(y) is a y-dependent gradient factor. (This analysis remains virtually unchanged if an additional x-dependence is added to $\delta\omega(y,z)$.) The two swept pulses in the presence of the alternating $\pm G_y$ gradient and of the constant gradient $G_z$ affect spins at a timing that now depends also on $\delta\omega(y,z)$. The resulting phase variant may be expressed as $$\phi_{enc}(y,z) = -Cy \cdot [\gamma G_z z + \delta\omega(y) + \gamma g(y)z].$$

Free evolution delay 52 includes a delay of duration $p_1/2$ to cancel de-phasing from slice selection RF pulse 30, plus a $T_a/2$ delay to suitably display the FOV that is to be rasterized. The resulting signal as a function of the acquisition time t may be written as $$S(t) \propto \int_Y \left[ \int_Z dz \rho(y) \cdot e^{i[-Cy \cdot [\gamma G_z z + \delta\omega(y) + \gamma g(y)z]]} e^{i[\gamma G_z z + \delta\omega(y) + \gamma g(y)z](t - T_a/2)} \right] dy$$

For simplicity, the effects of spin-relaxation, diffusion-derived losses, and/or inhomogeneities in the RF transmitting or receiving efficiencies have been ignored. It may be noted that the integration range along Z is defined by the slice's dimensions and by the nature of any shifts and inhomogeneities. The integration is over the range $$\frac{-L_z/2 - \delta z(y) - z_0}{1 + \varepsilon(y)} \leq z \leq \frac{+L_z/2 - \delta z(y) - z_0}{1 + \varepsilon(y)},$$

where $L_z$ is the nominal thickness of the slice, ignoring any influence of field inhomogeneities. The shift $\delta z(y) = \delta\omega(y)/(\gamma G_z)$ results from field inhomogeneities along the y axis, while the shift $\varepsilon(y) = g(y)/G_z$ is similarly associated to the z axis. The nominal slice center $z_0 = 2\pi O_{slice}/(\gamma G_z)$ is defined by slice selection RF pulse 30 and by the centers of frequency-swept RF pulses 32a and 32b, and which may, for simplicity, be taken to be $z_0 = 0$. Defining the parameters $k(t) = \gamma G_z(t - T_a/2)$ and $C' = C\gamma G_z$, the signal may be expressed as:

$$S(t) \propto \int_Y \left[ \int_{\frac{-L_z/2 - \delta z(y)}{1 + \varepsilon(y)}}^{\frac{+L_z/2 - \delta z(y)}{1 + \varepsilon(y)}} dz \rho(y) \cdot e^{i\{[-C'y + k(t)][1 + \varepsilon(y)]z\}} e^{i\{[-C'y + k(t)]\delta z(y)\}} \right] dy.$$

This can be further simplified as $$S(t) \propto \int_Y \rho(y) e^{i\{[-C'y+k(t)]\delta z(y)\}} \cdot \left[ \int_{\frac{-L_z/2-\delta z(y)}{1+\varepsilon(y)}}^{\frac{+L_z/2-\delta z(y)}{1+\varepsilon(y)}} dz \cdot e^{i\{[-C'y+k(t)][1+\varepsilon(y)]z\}} \right] dy =$$

$$\int_Y dy \rho(y) \frac{L_z}{1+\varepsilon(y)} \cdot \mathrm{sinc}\left\{ [-C'y+k(t)] \cdot \frac{L_z}{2} \right\}.$$

Since this expression is remarkably similar to the expression given above for the ideal case, the image may not be sensitive to the presence of inhomogeneities. The sole contribution of the inhomogeneities is the presence of $\varepsilon(y)$ influence, indicative of through-plane inhomogeneities may vary the thickness of the excited slices, and may affect the intensity of the scanned image. The term $\varepsilon(y)$ could also include potential y-independent terms arising from chemical shifts, which may homogeneously shift the position of the slice selection.

Figure 5:
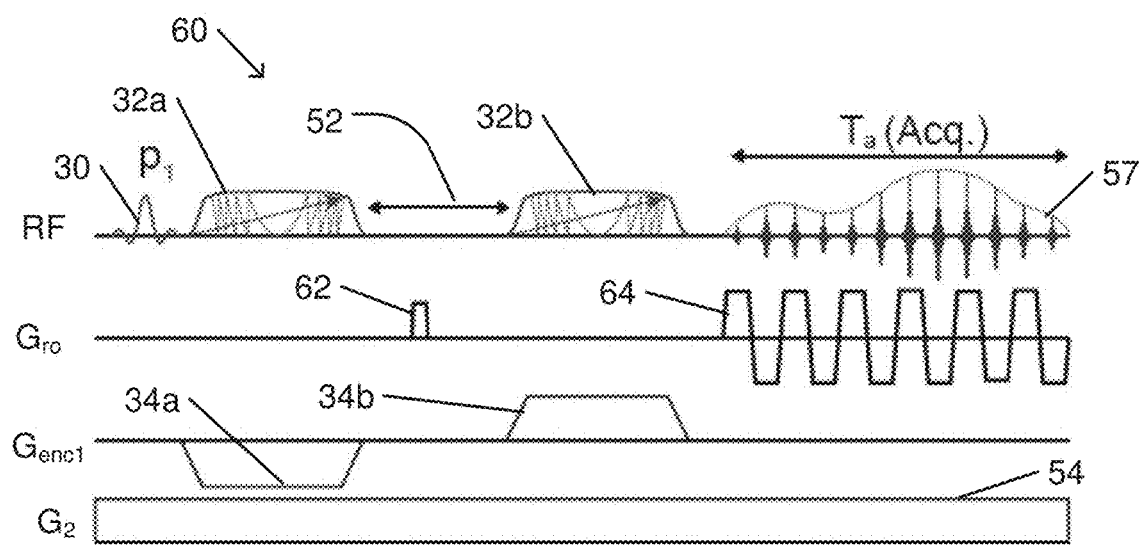
FIG. 5 schematically illustrates a modification of the sequence shown FIG. 4 for two dimensional hybrid mode operation.
Figure 6A:
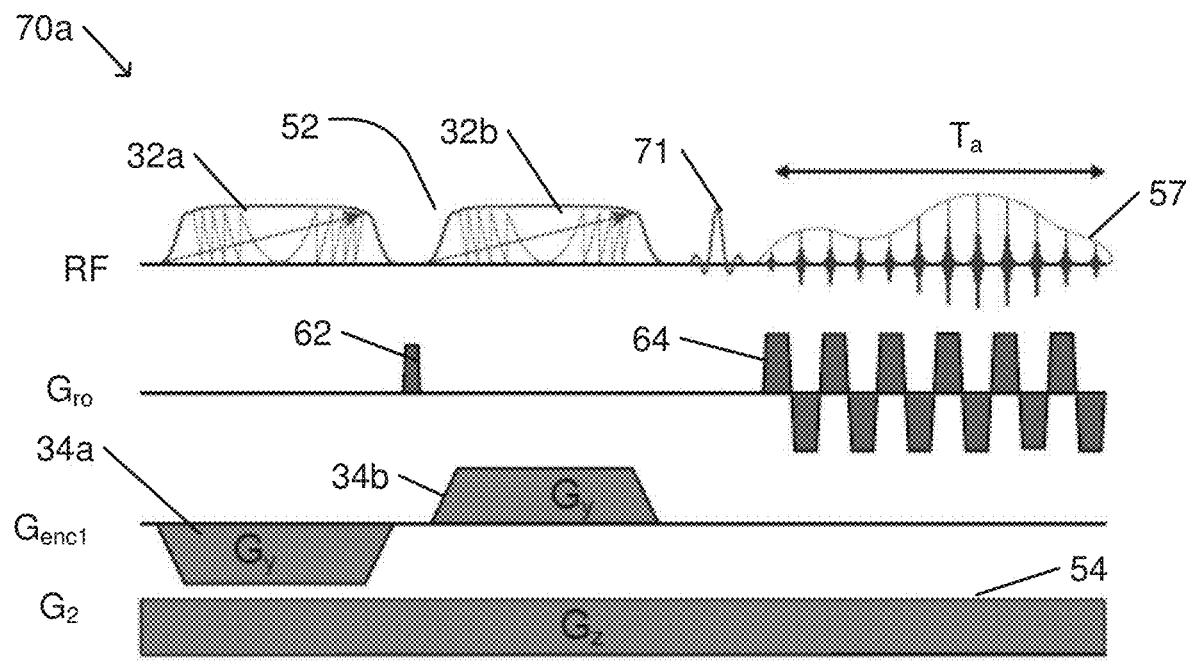
FIGS. 6A-6D schematically illustrate variants of the sequence shown in FIG. 5.
Figure 6B:
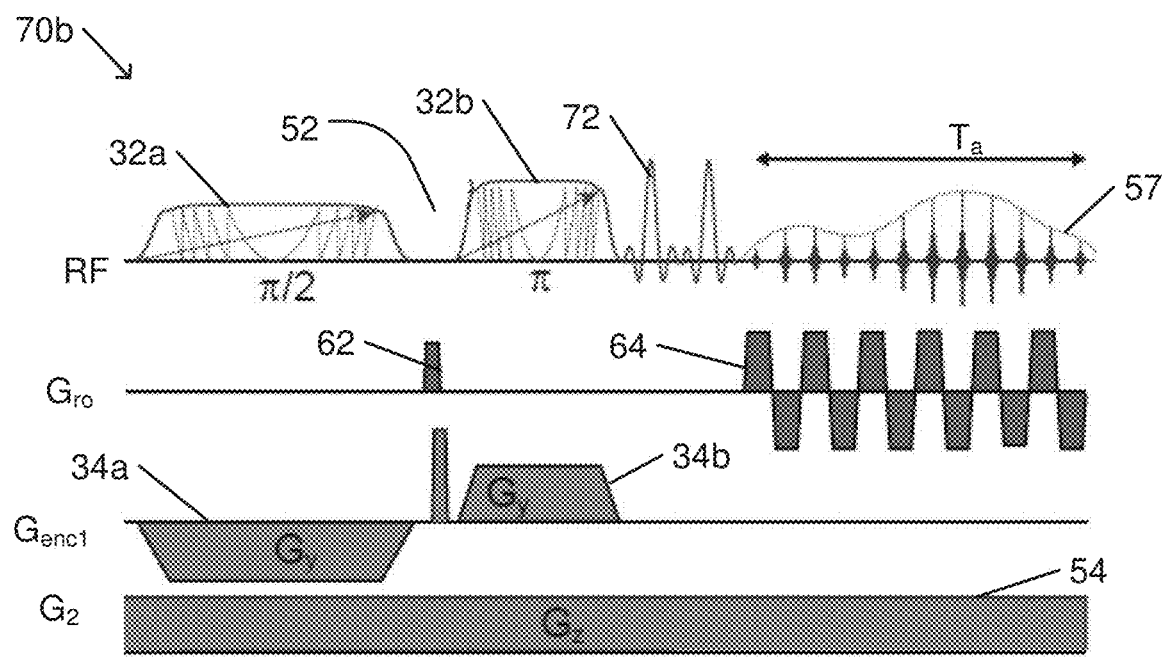
Figure 6C:
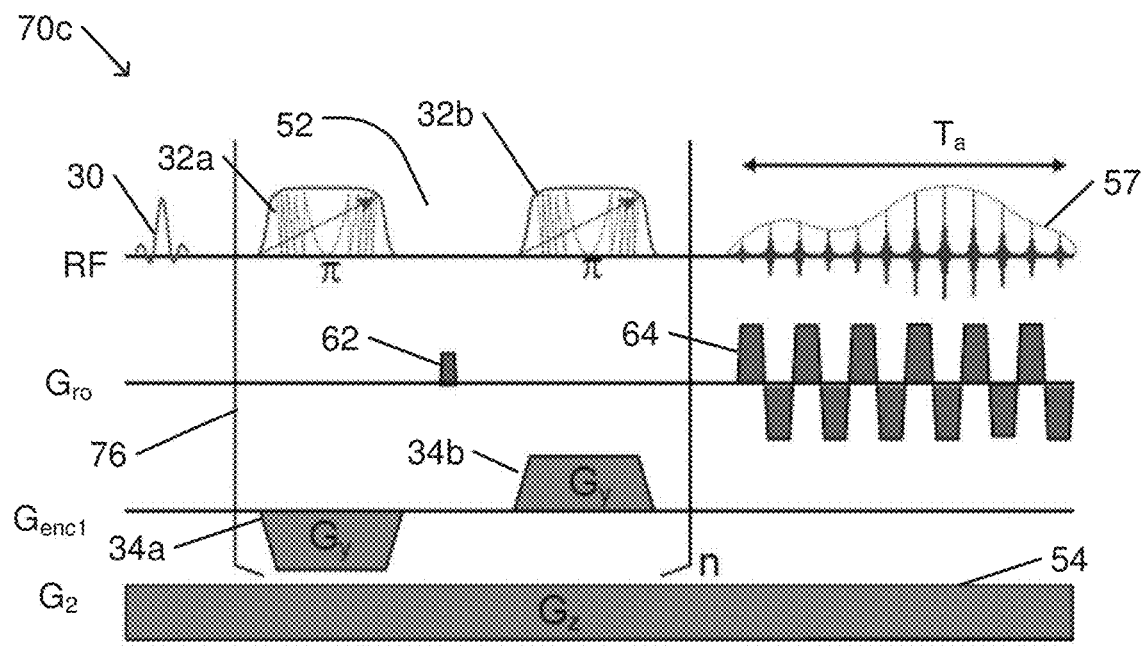
Figure 6D:
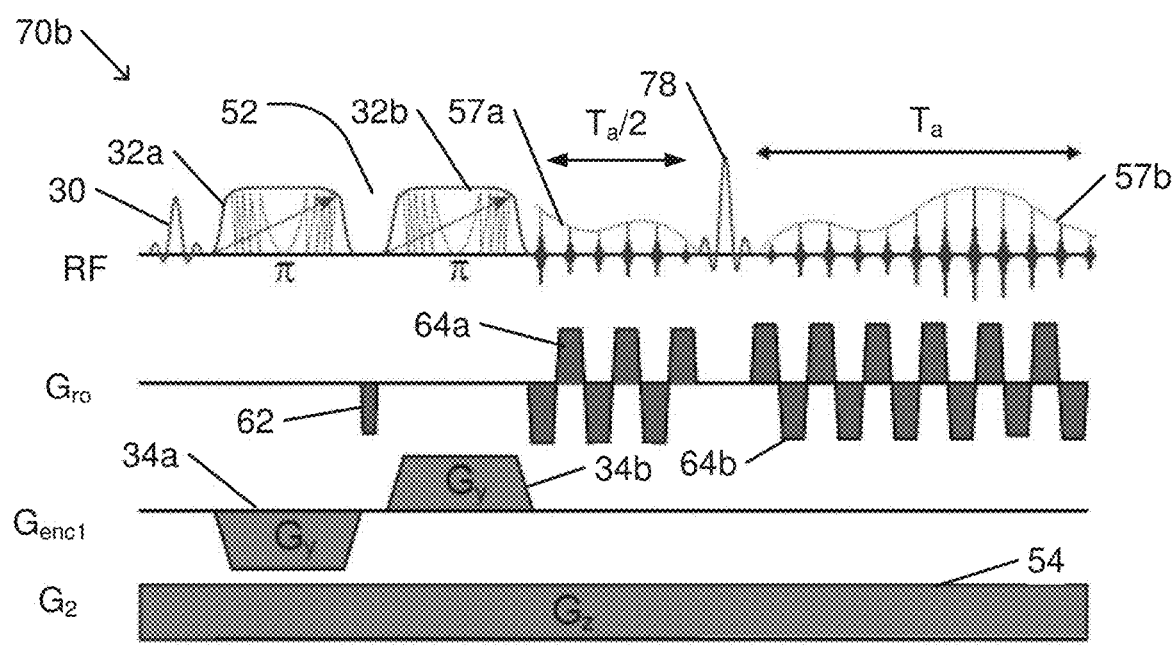

FIG. 5 schematically illustrates a modification of the sequence shown FIG. 4 for two dimensional hybrid mode operation. In sequence 60, an encoding that is a hybrid of (real space) xSPEN and (inverse space) spatial frequency encoding along an axis of inverse space (e.g., along the $k_x$ axis that is conjugate to the spatial x axis) is applied. Oscillating and constant gradients transverse the relevant ($k_x$, y) space.

Inverse space encoding is achieved by applying k-space encoding gradients along a third, readout (ro), axis (e.g., the x axis). An initial gradient 62 may be applied along the ro axis during free evolution delay 52 in order to carry out an echoed sampling of the readout k-encoded information. After application of encoding gradient pulse 34b and frequency-swept RF pulse 32b, oscillating readout gradient 64 with oscillating values of $\pm G_{ro}$ may be applied during acquisition of sampled signal data 57. Application of oscillating readout gradient 64 may cause signal detection to be scanned across a dimension (e.g., $k_x$) of the inverse space.

The data sampled during the acquisition may be transformed into xSPEN images by splicing the one-dimensionally-sampled. FID signal into $\pm G_{ro}$-sampled segments. The segments may be positioned at their correct coordinates in the relevant two-dimensional space. A one dimensional Fourier transform may be applied to these rearranged arrays. The magnitude of the resulting matrix may be displayed. Super-resolution construction procedures may also enhance the quality of the image, its resolution, or diminish the RF deposition requirements without impacting the images.

The received signal, $S(k_x,k(t))$, in the basic xSPEN case may be written as:

$$S(k_x, k(t)) \propto \int_X dx \cdot e^{ik_x x} \int_Y dy \rho(x,y) \frac{L_z}{1+\varepsilon(x,y)} \cdot \mathrm{sinc}\left\{ [-C'y+k(t)] \cdot \frac{L_z}{2} \right\}$$

where relaxation and diffusion are neglected. Here $\rho(x,y)$ is a two-dimensional profile that is being sought, which may be distorted by term $\varepsilon(x,y)=g(x,y)/G_z$ that is associated to an inhomogeneity $g(x,y)$, describing a frequency distribution, which, to first-order expansion along the z axis, may be expressed as $\delta\omega(v,y,z)=\delta\omega(x,y)+\gamma g(x,y)z$. After Fourier transforming this set against $k_x$ and proceeding with a magnitude calculation, a distortion-free $\rho(x,y)$ two-dimensional image may be obtained.

Sequence 60 may enable efficient multi-slicing performance despite its numerous long pulses. This ability stems from its reliance on initial slice selection RF pulse 30, followed by encoding involving a pair of frequency-swept RF pulses 32a and 32b in the form of it pulses. Since such a pair may be efficient even in the presence of RF field inhomogeneities, multi-slicing can be repeated in rapid succession despite the sample-wide sections that these inversion pulses address. Application of slice selection RF pulse 30 concurrent solely with application of a $G_z$ gradient, followed by application of the action of frequency-swept RF pulses 32a and 32b concurrent with application of combinations of $G_z$ and $+G_y$ gradients, defines slabs through the imaged subject. In some instances, these slabs are defined even without the action of RF pulse 30. The slabs are oriented relative to the originally selected slice at inclinations that depend on the ratio $G_z/G_y$.

In xSPEN, a z-gradient may be applied for slice selection (SS) in combination with oblique (y,z)-gradients for encoding. This may be considered, for simplicity, in the absence of field inhomogeneities or offset effects. To effectively address spins that are positioned in a pre-defined region defined by $FOV_y \times L_z$, the bandwidth BW of the frequency-swept pulses should satisfy $BW=(\gamma G_y FOV_y+\gamma G_z L_z)/2\pi$. If the $G_y$ and $G_z$ gradients were equal, the sweep would address spins along a diagonal band oriented at 45° in a (y', z')-plane that is defined on the basis of FOV-normalized coordinates: $y'=y/FOV_y$, $z'=z/L_z$. It is convenient to define a parameter $\beta=\gamma G_y FOV_y/(2\pi BW)$ that describes the inclination and the extent of the diagonal spatial bands that are addressed by the pulses. For example, the case of equal $G_y$ and $G_z$ gradients corresponds to $\beta=0.5$. In general, $0<\beta<1$.

It may be noted that the spins addressed by this xSPEN sequence, those that are excited by the initial slice selective pulse which is only sensitive to $G_z$, are subsequently inverted by the first of the frequency-swept pulses concurrent with application of $-G_y$ and $+G_z$ gradients, and are subjected to a second inversion process arising from an identical swept RF pulse concurrent with application of $+G_y$ and $+G_z$ gradients. Thus, the relevant observable image arises at an intersection of a z-selective band excited by the initial pulse with two diagonal bands that are subsequently addressed by the RF sweeps. Due to the reversal of the $G_y$ gradient, the diagonal bands are related by a reflection about the z axis. The reliance of multi-slice xSPEN on these three pulses divides the object to be imaged into different regions in the y-z plane. Spins that lie outside the slice are not observed in the slice's imaging scan. Spins within the slab may be separated into four regions, according to the effect on them by the two subsequent adiabatic inversion pulses. Some of the spins may have undergone full $2\pi$-inversions imparted by the two swept pulses. These spins may be cross-spatiotemporally-encoded, and thus contribute to the final image. The spins in some regions may undergo a single $\pi$-inversion or no inversion at all. These regions do not contribute to the observable image despite lying within the excited slice. There may be spins in the boundary regions of the chirped pulses whose nutation angles are ill-defined. These spins may be relevant towards the planning of multi-slice acquisitions.

A multi-slice strategy may require re-encoding spins at variable positions along the z axis without an intervening recycle delay. This in turn requires that the spins adjacent to an excited slice undergo either no rotation or a full $2\pi$ inversion as a result of the slice's dual frequency sweeps. Adjacent slices contain both kinds of spins, as well as spins that have gone through a single $\pi$-flip. Alternative xSPEN sequences may cause all rotations experienced by the spins due to the effects of the adiabatic sweeps to be $2\pi n$, n=0.1, . . . , regardless of position. Since the spins along the diagonal boundaries of the imaged regions may be ill-defined, re-exciting spins that fall along these boundary lines may be avoided. Thus, unexcited band-gaps may be left in zero-delay multi-slice operation. Decreasing the bandwidth ratio β increases the overlap among the diagonal regions that are addressed by the sweeps, enlarging the imaged slice dimension and reducing the gaps that are unavailable in multi-slice measurements.

FIGS. 6A-6D schematically illustrate variants of the sequence shown in FIG. 5.

Application of xSPEN in all these variants includes imparting a spatiotemporal encoding that leads to cross-terms, e.g., of the form $\phi_{enc}=Cyz$, in the phase evolution of the spins.

In sequence 70a, frequency-swept RF pulses 32a and 32b are π/2 chirped pulses. Frequency-swept RF pulse 32a may perform a spatiotemporal excitation and frequency-swept RF pulse 32b may store the magnetizations. Avoiding the use of swept π pulses may reduce the power deposition may conclude the encoding hyperbola at the edge, rather than in the center, of the imaged subject. This latter feature shifts the image by $FOV_y/2\beta$. For sufficiently large β values, there may be no need for $k_{pre}$, a prewinding that required inserting an inter-π-pulse evolution period $T_a/2$ under the action of the $G_z$ gradient, and which may be associated with signal losses. On the other hand, sequence 70a lacks a multi-slicing capability and therefore slice selection needs to be introduced by a (third) excitation pulse 71. The encoding efficiency of a π/2 pulse is half that of its π-pulse counterpart, thus requiring pulses of longer duration $T_p$ for achieving a comparable resolution.

Sequence 70b includes encoding that is executed by frequency-swept RF pulse 32a in the form of a π/2 excitation pulse, and frequency-swept RF pulse 32b in the form of a π inversion pulse, each of length $T_p$. If $G_z$ is kept constant, this combination requires inserting $k_{pre}$ by a $(T_a-T_p)/2$ delay between frequency-swept RF pulse 32a and frequency-swept RF pulse 32b, as well as two subsequent slice-selective π-pulses 72, each of length $p_1$, to impart selectivity along z. (Although possible with a single π-pulse, the coherence pathway that would result may prevent scanning the image without reversing $G_z$.)

Sequence 70c includes encoding by a train of n sets 76 of frequency-swept RF pulses 32a and 32b in the form of π chirped pulses, separated by a free evolution delay 52. Applying such multiple $\pm G_y$ oscillations may reduce the diffusion losses incurred by $\bar{G}_y$. If n is chosen to be an even number, regions of π-inverted spins may be removed.

Sequence 70d makes full use of the sequence time by eliminating pre-phasing evolution periods. In sequence 70d, sampled signal data 57a is acquired for period $T_a/2$ during application of oscillating pulse 64a, immediately after the encoding, leading to the initial formation of half of the image. An additional full image sampled signal data 57b of duration $T_a$, concurrent with application of oscillating pulse 64b, is acquired within the same scan by the generation of a suitable, slice-selective spin-echo 78 of duration $p_2$.

If it is assumed in that all adiabatic sweeps in sequences 70a-70d proceed over identical bandwidths satisfying $BW=(\gamma G_y FOV_y+\gamma G_z L_z)/2\pi$, and are all characterized by a bandwidth ratio $\beta=\gamma G_y FOV_y/(2\pi BW)$ (0<β<1), it then follows that for these sequences to operate properly the swept pulse durations have to fulfil $T_p=T_a/(2\beta)$ for sequences 70a and 70b, $T_p=T_a/(4n\beta)$ for sequence 70c, and $T_p=T_a/(4\beta)$ for sequence 70d.

Partial Fourier transform techniques may be used to improve MRI sensitivity without sacrificing resolution. For example, the partial Fourier transform may be applied along the readout dimension of xSPEN, improving resolution along the readout dimension at no penalty in sensitivity. Although xSPEN monitors the low-bandwidth phase encoding (PE) dimension in real-space, as opposed to k-space sampling for the readout dimension, partial Fourier transform techniques may also be applied along the phase encoding dimension. This may also enable improvement in resolution along the phase encoding dimension at no penalty in sensitivity.

Figure 7:
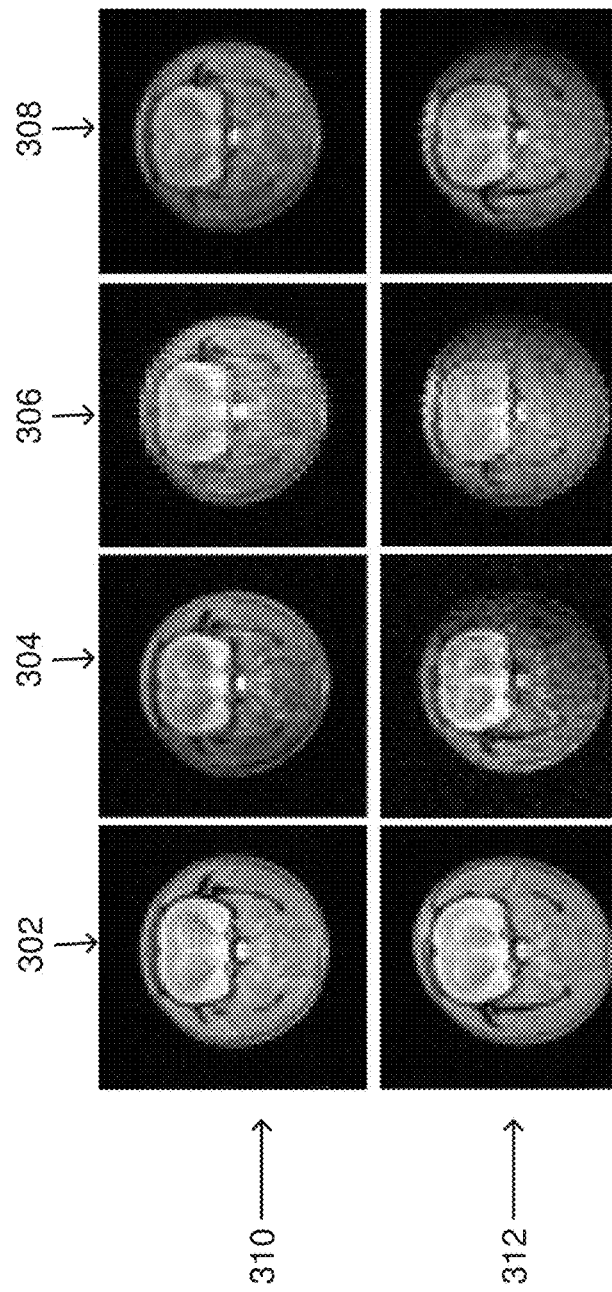
FIG. 7 illustrates results of application of partial Fourier transform techniques to an xSPEN imaged sample, in accordance with an embodiment of the present invention.

FIG. 7 illustrates results of application of partial Fourier transform techniques to an imaged sample, in accordance with an embodiment of the present invention. FIG. 7 shows MRI images that were acquired of an excised brain of a rat using various MRI techniques.

Row 310 includes images resulting from application of partial Fourier transform techniques along the readout dimension. Row 312 includes images resulting from application of partial Fourier transform techniques along the phase encoding dimension.

Multi-scan spin echo (SE) images 302 serve as reference images, and have been fully sampled (e.g., on a 64×64 matrix). Partially sampled xSPEN images 306 (e.g., on a 64×40 matrix) may be acquired during a significantly shorter time than the scan time needed for acquiring fully sampled xSPEN images 304. Fully reconstructed images 308 have been reconstructed to the full (e.g., 64×64) matrix from partially sampled xSPEN images 306.

The resolution of xSPEN images may be further improved while reducing the deposited power (e.g., as quantified by the specific absorption rate, or SAR, thus reducing heating of the patient) and increasing signal-to-noise ratio (SNR), by application of a super-resolution technique. Application of a super-resolution technique includes increasing the frequency components of the xSPEN convolution kernel function. In the form described above in connection with FIG. 4, the convolution kernel is in the form of a sinc function having a sharp cutoff effect, thus impeding computation of the higher frequency components required for application of super-resolution.

Figure 8A:
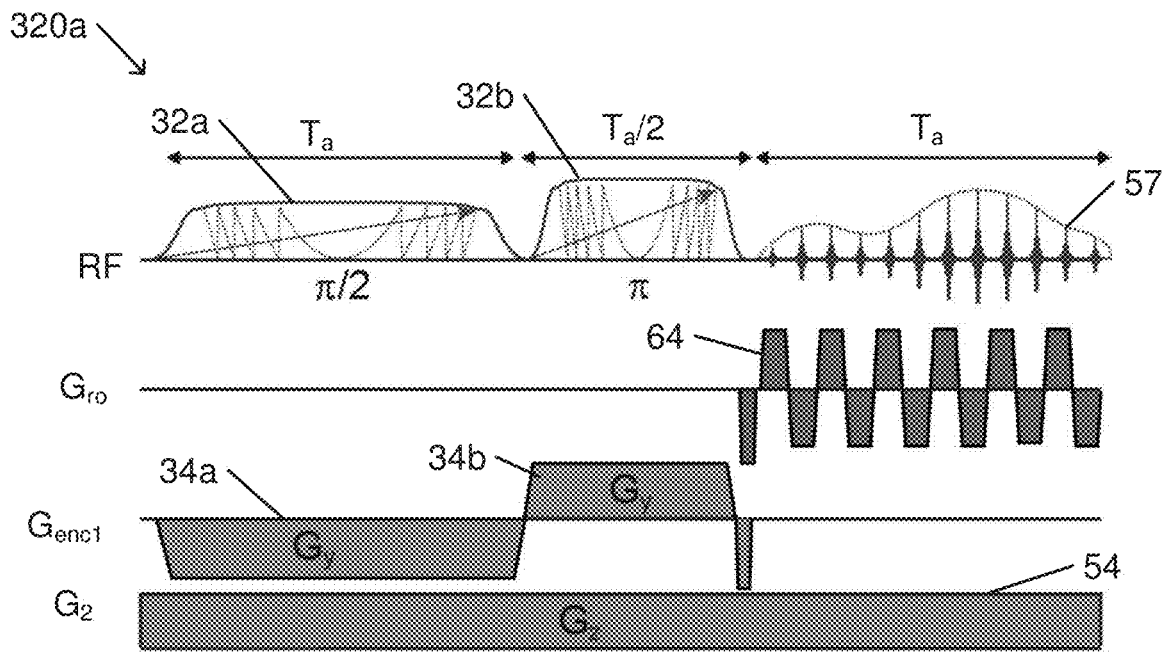
FIG. 8A illustrates a sequence for enabling application of super resolution to xSPEN, in accordance with an embodiment of the present invention.

FIG. 8A schematically illustrates a sequence for enabling application of super resolution to xSPEN, in accordance with an embodiment of the present invention.

Application of sequence 320a replaces the typical square-like slice selection with a diamond-shaped slice selection as would result from application of xSPEN π/2-π spatiotemporal encoding (e.g., as by sequence 70b without slice-selective π-pulses 72). Thus, the resolution is no longer determined by a sinc point-spread function. In this case, the support of the y-axis image at the center of this axis FOV is twice as large as at it is at the edges. This implies that for these y-axis positions, a higher spatial resolution is achievable A super-resolution algorithm may exploit this in order to double the effective resolution throughout the phase encoded y-axis dimension.

Figure 8B:
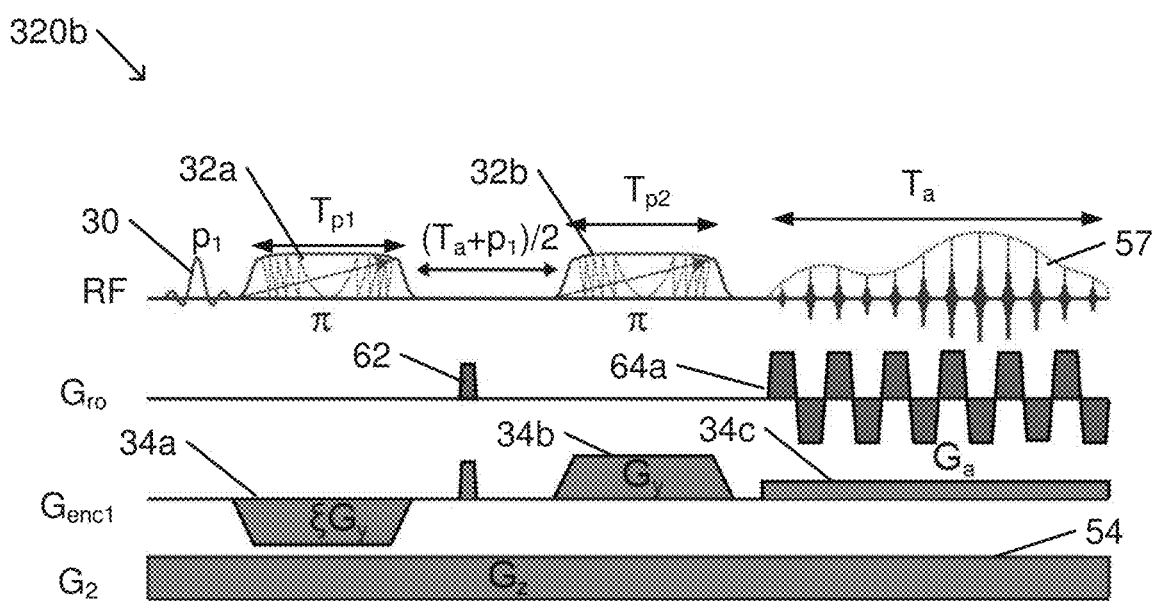
FIG. 8B schematically illustrates a variant sequence for enabling application of super resolution to xSPEN, in accordance with an embodiment of the present invention.

FIG. 8B schematically illustrates a variant sequence for enabling application of super resolution to xSPEN, in accordance with an embodiment of the present invention.

In sequence 320b, the complete phase cancellation associated with the xSPEN sequences described above may be broken. For example, encoding gradient pulse 34a and inverted encoding gradient pulse 34b may have different strengths (e.g., as indicated by multiplicative factor ξ). This inequality may provide a phase modulation that broadens the frequency of the sine function convolution kernel. In addition, an acquisition gradient 34c may be applied concurrently with acquisition of sampled signal data 57. This broadening may be used to improve the resolution of xSPEN. The phase modulation may also be generated by a nonlinear gradient coil or a higher-order shim coil capable of introducing a quadratic $y^2$ dependence into the phase of the signal, as well as by increasing the number of sweep pulses.

In addition to single scan two dimensional xSPEN, numerous variations can be conceived for implementing two-dimensional multi-shot xSPEN MRI image acquisition.

For example, image acquisition may be segmented. Segmenting may involve performing multiple scans to improve the SNR of the images.

Figure 9:
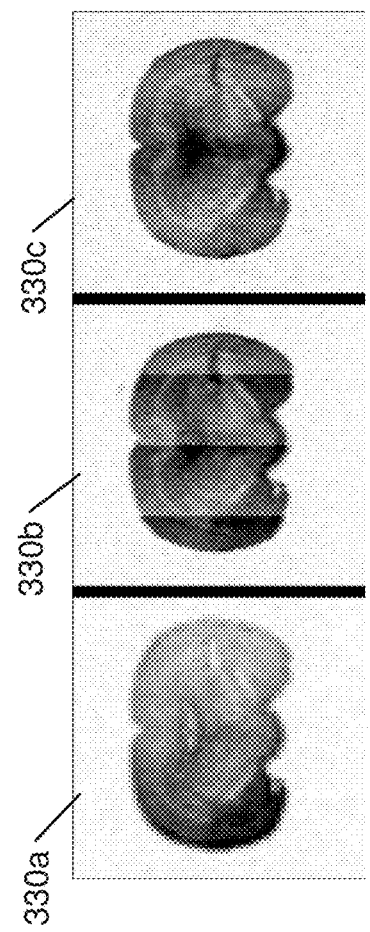
FIG. 9 illustrates results of application of a segmented acquisition, in accordance with an embodiment of the present invention.

FIG. 9 illustrates results of application of segmented acquisition, in accordance with an embodiment of the present invention.

Image 330a represents an image that is acquired by application of non-segmented xSPEN (averaging four scans). Unlike techniques that perform segmentation in k-space, such as xSPEN segmentation is performed in image space. Therefore, the segmented xSPEN images can be acquired by reducing acquisition times so as to limit sampling to a reduced portion of the spatiotemporal phase encoding dimension. The full FOV can then be covered by a multi-shot acquisition of adjacent segments, as was done to acquire image 330b. As seen in image 330b, discontinuities between neighboring segments may be caused by $T_2$-driven and diffusion-driven decay between acquisition of the segments. Changing the sweep directions of the different chirp pulses between acquisitions of neighboring segments may reduce these discontinuities, as seen in image 330c.

Figure 10A:
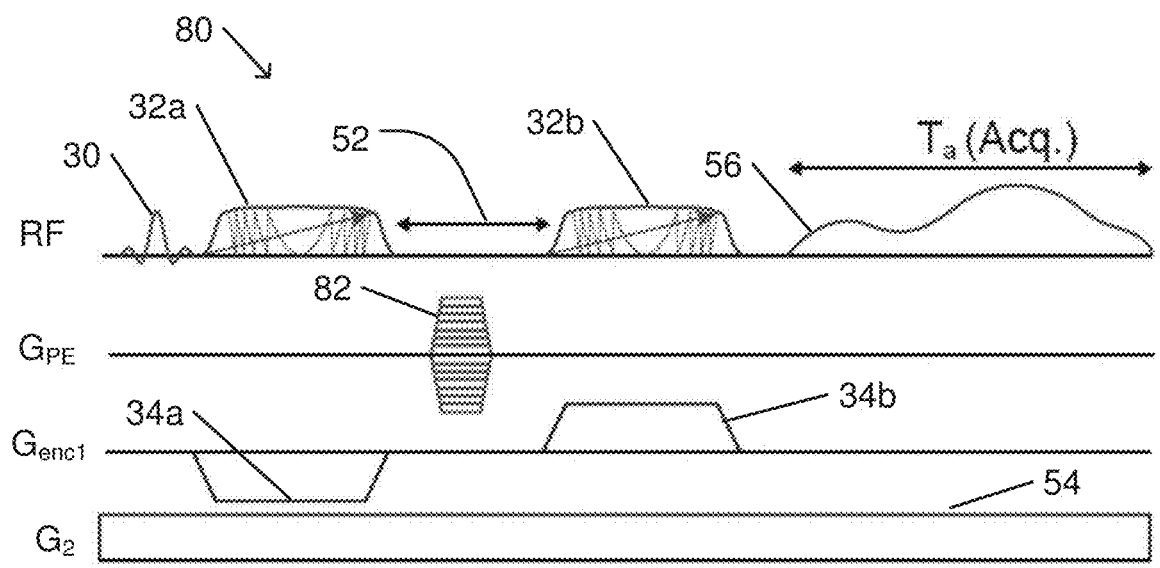
FIG. 10A schematically illustrates a sequence for multi-scan two dimensional xSPEN (xSPENms) MRI, in accordance with an embodiment of the present invention.
Figure 10B:
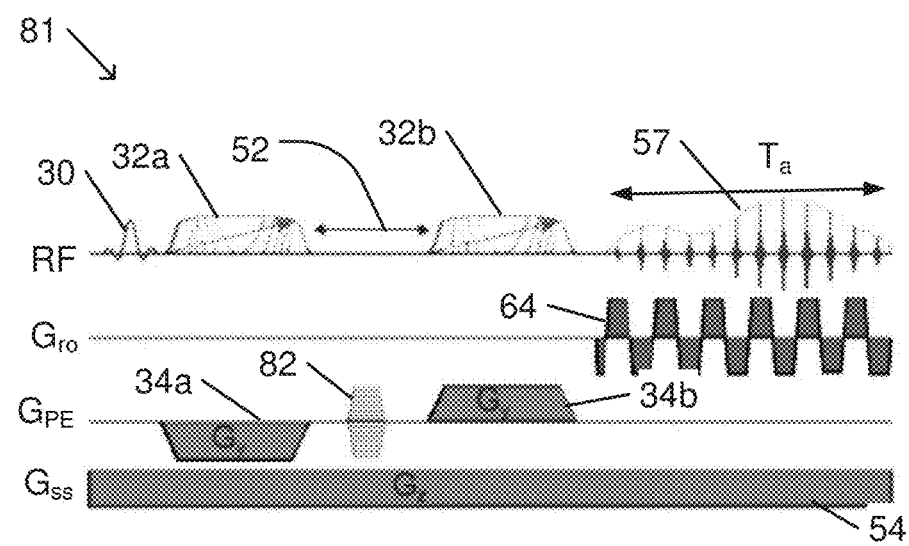
FIG. 10B schematically illustrates a variant of the sequence for xSPENms shown in FIG. 10A.

FIG. 10A schematically illustrates a sequence for multi-scan two dimensional xSPEN (xSPENms), in accordance with an embodiment of the present invention. FIG. 10B schematically illustrates a variant of the sequence for xSPENms shown in FIG. 10A.

Sequence 80 or 81 includes application of variable gradient 82 along the phase encoding (PE) axis. Variable gradient 82 represents a gradient whose strength varies from scan to scan, so as to apply a usual phase encoding of the kind leading to the image along the PE-axis by Fourier analysis. The resulting xSPENms images may be more immune than single-scan xSPEN images to distortion due to magnetic field inhomogeneities.

In some cases of sequence 81, frequency-swept RF pulse 32a and frequency-swept RF pulse 32b may each have a length of $T_a/2$ and free evolution delay 52 may have duration $(T_a+p_1)/2$.

Phase encoding along an additional dimension may enable full three-dimensional image acquisition. An image that is acquired using two phase encoding dimensions and one xSPEN readout dimensions may be free of distortion due effects of field inhomogeneities in all dimensions.

Given the large bandwidth that is used in order to acquire xSPENms images without reduction in resolution, super-resolution techniques, as described above, may be utilized in order to avoid increasing the intensities or strengths of the applied RF fields and gradients (and thus avoiding increasing the power that is deposited in the patient).

In order to minimize diffusion losses, the condition $N_{acq} = \gamma G_z L_z T_a/2\pi$ may be imposed and $T_a$ may be set as small as allowed by the power limitations of the adiabatic pulses.

Application of phase encoded xSPEN, also referred to as multiscan xSPEN (xSPENms) may result in redundancy of information along different dimensions (e.g., the PE and SS dimensions). The redundancy may enable obtaining images of a particular sensitivity, FOV, or resolution in less time than would be required by other techniques. In the example of sequence 81, sampling of data along the PE axis may be reduced by skipping sampling along the phase encoding (PE) axis in the reciprocal space, as in the example shown, or along the direct readout (ro) axis. Such down-sampling typically leads to "folded over" images. When applying xSPENms, processing that includes application of a zero-padded Fourier transform, application of shearing transformations, and windowing cropping that prevents such fold-over phenomena may be applied.

Figure 10C:
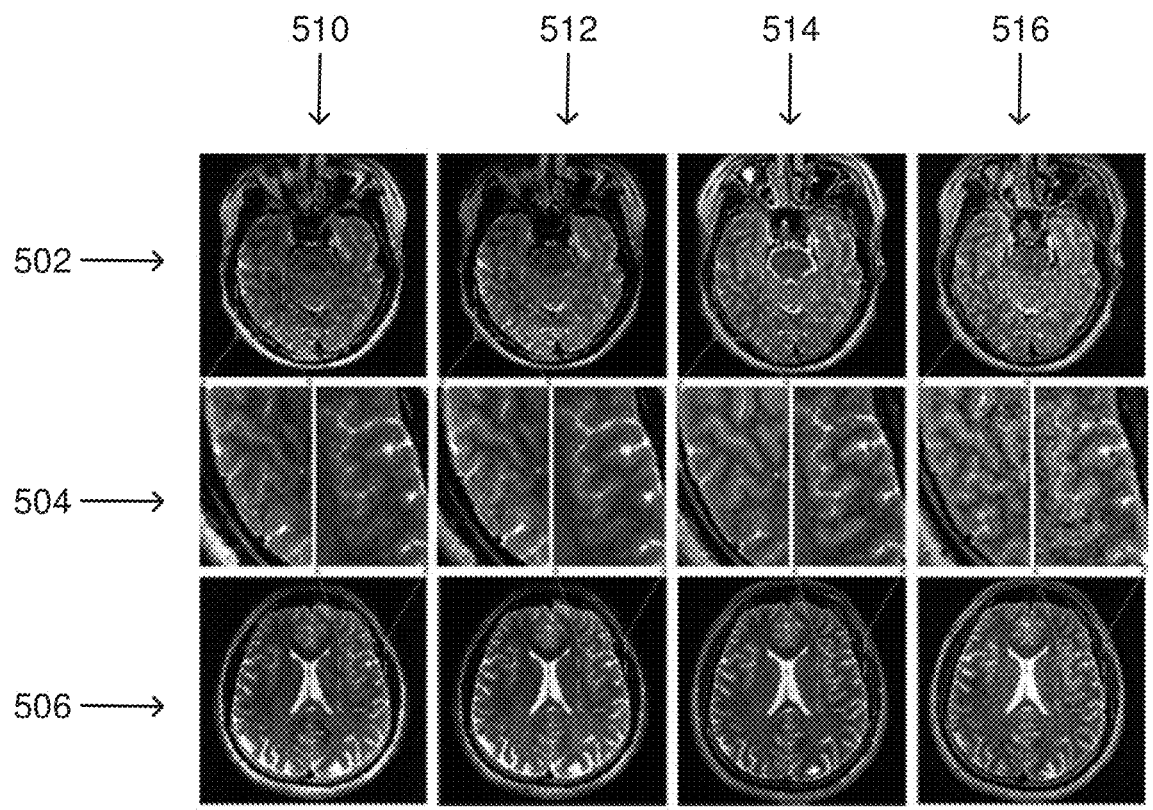
FIG. 10C compares images obtained by different MRI techniques.

FIG. 10C compares images obtained by different MRI techniques.

Slices 502 and 506 of a human brain were acquired. Images 504 are enlarged images of the indicated regions of slices 502 and 506. Images 510 were acquired by applying phase encoded xSPEN with repetition time (TR) of 2 seconds (total scan time of 6.4 minutes). Images 512 were acquired by applying phase encoded xSPEN with TR of 4 seconds (total scan time of 12.8 minutes). Images 514 were acquired by three-dimensional turbo spin-echo (TSE) MRI with TR of 4 seconds (total scan time of 16.9 minutes). Images 516 were acquired by two-dimensional TSE MRI with TR of 8.2 seconds (total scan time of 16.5 minutes).

Figure 10D:
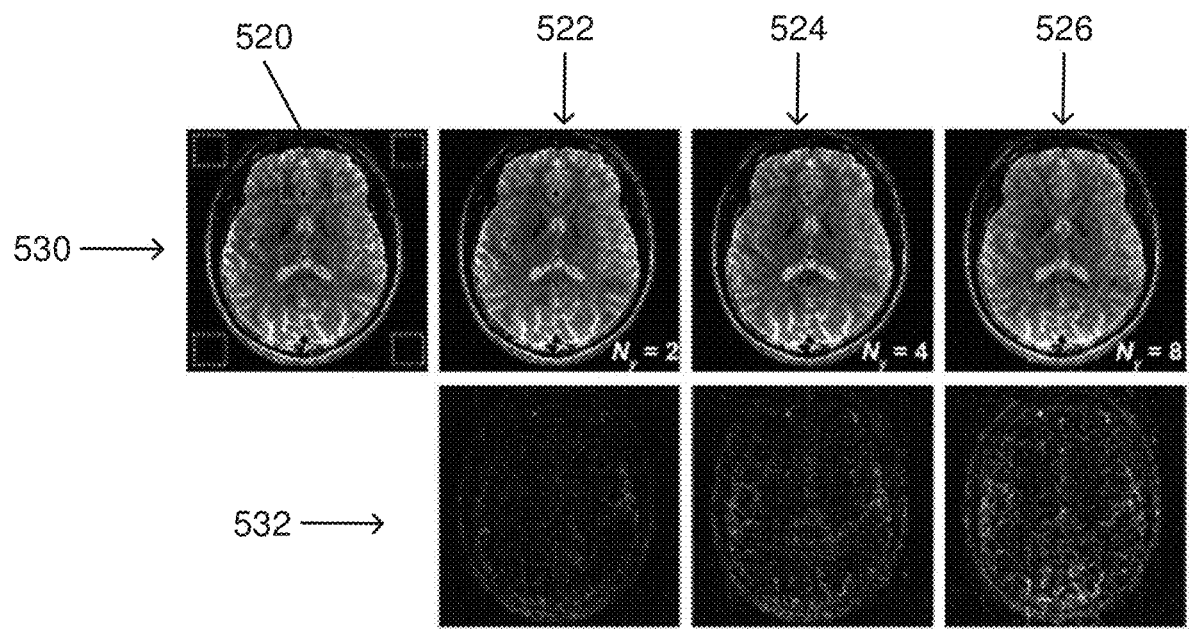
FIG. 10D compares images obtained by phase encoded xSPEN with different down-sampling factors.

FIG. 10D compares images obtained by phase encoded xSPEN with different down-sampling factors.

Images in row 530 were acquired using phase encoded xSPEN, Image 520 was acquired without down-sampling, while images in columns 522, 524, and 526 were acquired with down-sampling factors of 2, 4, and 8, respectively. Difference image 532 in each column 522, 524, or 526 represents the difference between the corresponding image 530 in that column and image 520. Analysis of the images shows few if any discernable artifacts when the down-sampling factor is less than 8.

Despite this capability, it has been noted that, while the resolution within each slice is not significantly affected, such procedures may result in limited resolution only along the SS axis. These compromises may be removed by incorporating multiple receivers, as are available in clinical scanners, into the processing scheme.

Figure 10E:
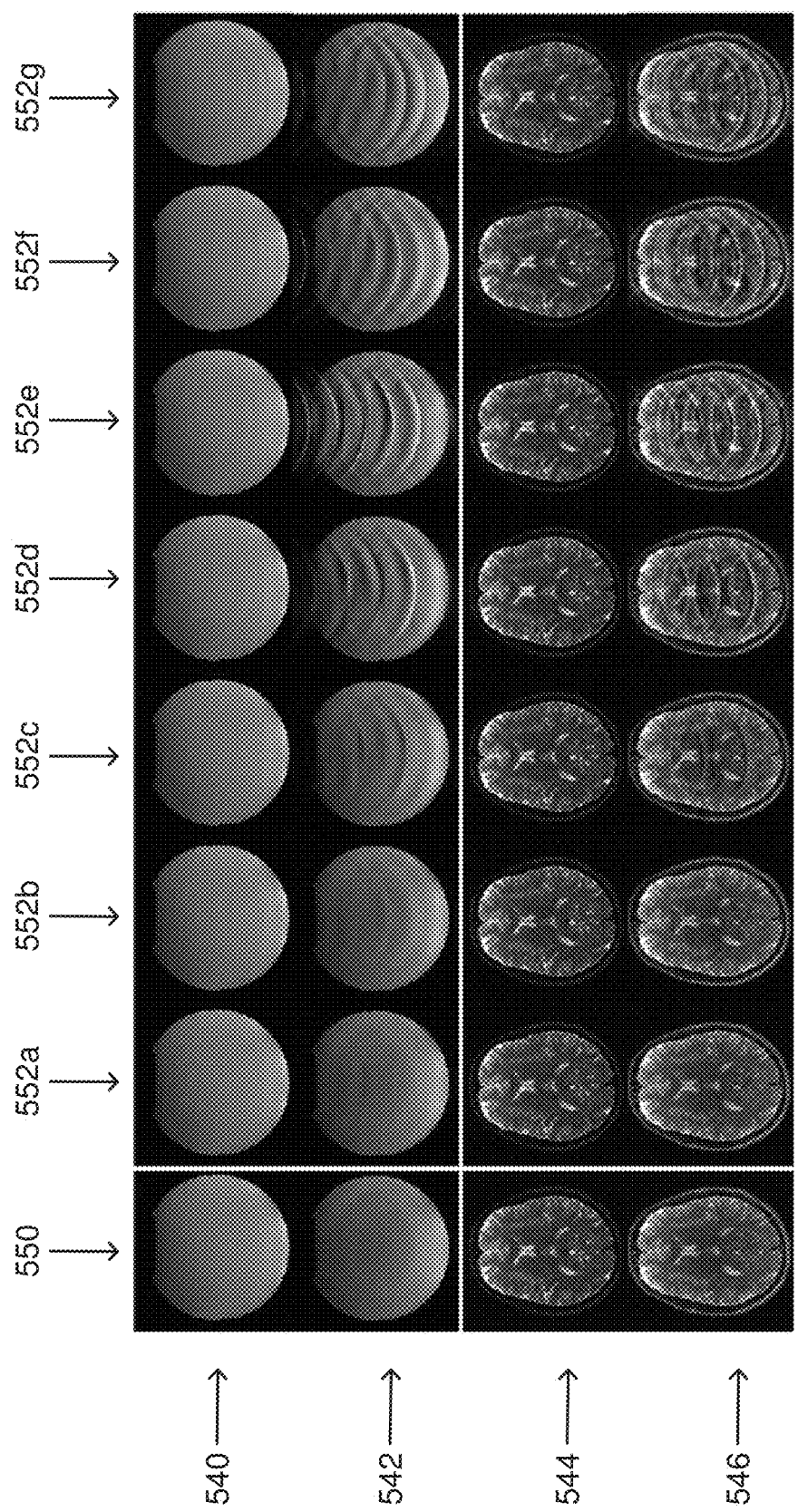
FIG. 10E compares images obtained by phase encoded xSPEN (xSPENms) using multiple receiver information with images obtained by three-dimensional turbo spin echo (3D TSE) imaging for different down-sampling factors.

FIG. 10E compares images obtained by phase encoded xSPEN (xSPENms) using multiple receiver information with images obtained by three-dimensional turbo spin echo (3D TSE) imaging for different down-sampling factors.

Rows 540 and 542 include images of a water phantom and rows 544 and 546 include images of a human brain. The images in rows 540 and 544 were obtained by application of three dimensional xSPENms using multiple receiver information. The images in rows 542 and 546 were obtained by application of 3D TSE (representing the state-of-the-art technique), also making use of the multiple receivers that are available in clinical scanners.

Images in column 550 were obtained with full sampling (including 192 increments along the PE axis, in the example shown). Images in columns 552a-552g were obtained with periodic skipping of lines ranging from 1 to 7, respectively. In all cases, the central 12 PE lines were densely sampled for calibration and sensitivity purposes. The acquisition time for the images in column 550 was 9.6 minutes, while the times that would be needed to collect the images in columns 552a to 552g are 5.1 minutes, 3.6 minutes, 2.8 minutes, 2.4 minutes, 2.1 minutes, 1.8 minutes, and 1.7 minutes respectively.

Images in rows 542 and 546 (3D TSE) show the onset of fold-over artifacts as soon as the number of skipped lines exceeds 2 or 3 (e.g., beginning with column 552c or 552d). The fold-over artifacts in rows 540 and 544 (3D xSPENms) are much weaker, or not discernable at all. Thus, application of 3D xSPENms may enable substantial reduction in the overall scanning times of the MRI, without compromising image quality.

Artifacts are known to form in MRI images in the vicinity of metallic implants. These potentially severe artifacts may be caused by metal-induced field inhomogeneities. In xSPEN, these artifacts may arise solely due to distortions in the slice-selection process, since in-plane distortions will already have been compensated for by the capabilities of single-shot 2D xSPEN.

Figure 11A:
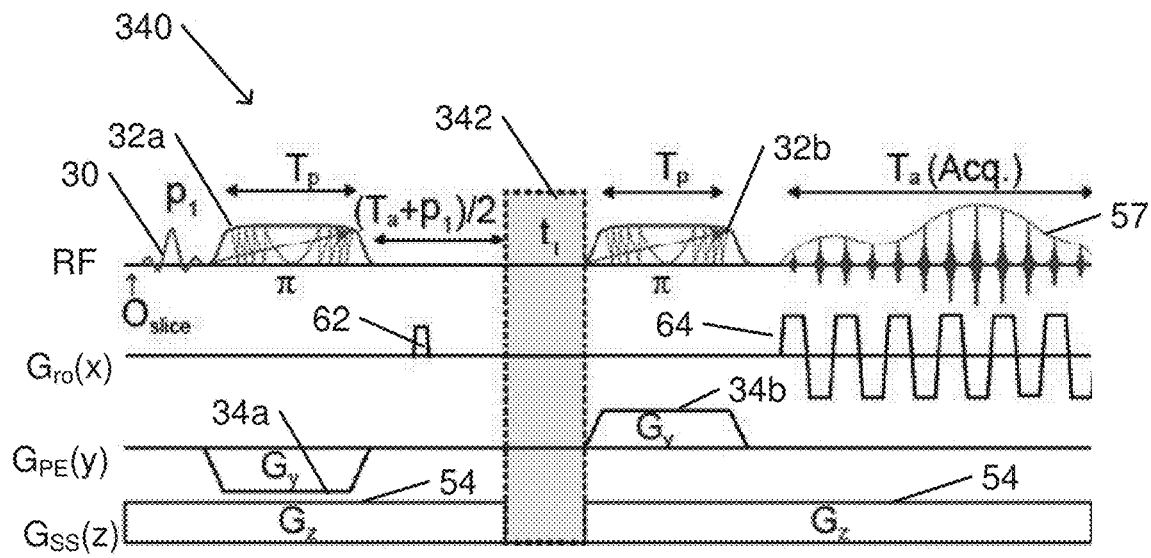
FIG. 11A schematically illustrates an xSPEN sequence with an encoding period, in accordance with an embodiment of the present invention.

FIG. 11A schematically illustrates an xSPEN sequence with an encoding period, in accordance with an embodiment of the present invention.

Sequence 340 incorporates an encoding period 342 of duration $t_1$ during which no RF pulses or field gradients are applied. Encoding period occurs between application of frequency-swept RF pulse 32a and frequency-swept RF pulse 32b. Encoding period 342 may enable quantifying the remaining out-of-plane slice distortions remaining in xSPEN by encoding their frequencies in a separate indirect domain. Fourier analysis of the encoded frequencies may enable repositioning spins in their correct spatial locations. The out-of-plane distortions may then be corrected in the bulk sample by summing the resolved contributions for each nominal slice.

Figure 11B:
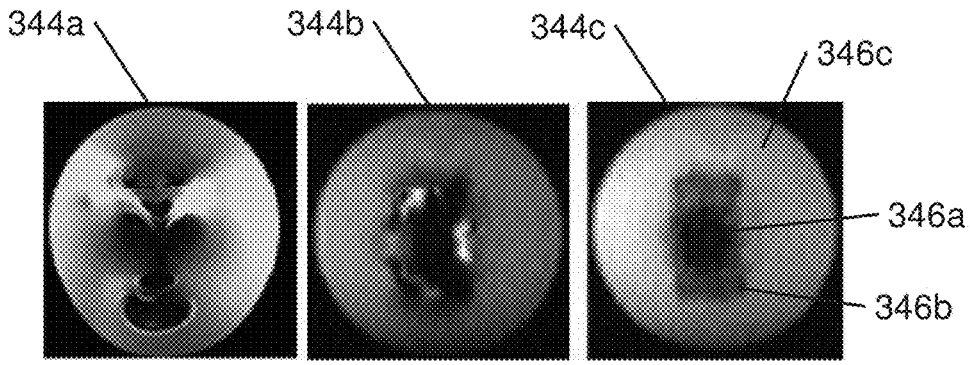
FIG. 11B illustrates application of the sequence shown in FIG. 11A for correction of an artifact caused by a metallic implant.

FIG. 11B illustrates application of the sequence shown in FIG. 11A for correction of an artifact caused by a metallic implant.

Images 344a to 344b are MRI images of phantom that simulates a hip joint with a metallic implant. The slice of the phantom that is imaged includes a metal rod at center, immediately surrounded by plastic flange. The metal rod and flange are inserted in a cylindrical container that is filled with agarose gel.

Image 344a was acquired application of turbo spin-echo (TSE) MRI. Image 344b was acquired by application of xSPEN. Severe artifacts are noticeable (e.g., in the form of distorted edges near the metal rod) in both images 344a and 344b. Image 344c was acquired by application of sequence 340. In image 344c, the severity of the artifacts is significantly reduced. In image 344c, the different components of the phantom are clearly delineated, namely, metal rod image 346a, plastic flange image 346b, and agarose gel image 346c.

Application of sequence 340 may also be applied to situations in which other types of frequency shifts (other than those introduced by metallic implants) are present. These situations include imaging in the presence of susceptibility shifts and to chemical shifts.

Addition of encoding period 342 may introduce an inhomogeneous $T_2^*$ decay that can be used to follow organ function via the blood-oxygen-level dependent (BOLD) contrast, as is customary in functional MRI.

Likewise, addition of suitable diffusion-weighting gradients into xSPEN, as is customary in application of diffusion MRI, may be used to measure isotropic and anisotropic diffusion behavior, while benefitting from the robustness of xSPEN to field inhomogeneities. Variations these sequences may be used for tracking morphology in organs, tissues and materials.

Although an orthogonal linear gradient may provide a source of frequency broadening to implement an xSPEN acquisition, other sources are possible. Such other sources could arise from static susceptibility- or shift-imposed three dimensional spatial frequency distributions, or from broadenings arising from intrinsic spin anisotropies like those present in solids or oriented samples. This source of inhomogeneous broadening could, in a suitably echoed measurement, act as the agent that reads out the desired imaging information, thus providing the function of the z-gradient 54 referred to above.

For example, intrinsic symmetric spin anisotropy that is characteristic of chemical shielding in the solid state may be assumed. The evolution of a spin ensemble is subject to a frequency distribution given by a second-rank Legendre polynomial $$f_{distribution}(\theta) = \Delta \frac{(3\cos\theta^2 - 1)}{2},$$

where $\Delta$ is a constant denoting the strength of the coupling (akin to shielding anisotropy), and $\theta$ is the angle subtended between the external magnetic field $B_o$ and the principal axis of the anisotropic interaction tensor. This spin ensemble may be subjected to a one dimensional sequence similar to sequence 50 (FIG. 4), but without application of gradient 54. The effective spins of interest may be excited by a pulse of bandwidth $f_{select}$ that selects a part or the whole of $f_{distribution}(\theta)$ that are inverted by frequency-swept RF pulse 32a concurrent with encoding gradient pulse 34a and $f_{distribution}$, and that subsequently re-inverted by an identical frequency-swept RF pulse 32b concurrent with inverted encoding gradient pulse 34b and $f_{distribution}$. This selectivity may constrain the addressed range of frequencies, and hence the $[\theta_{min}, \theta_{max}]$ range of relevant angles supporting the y-image acquisition process. The signals collected as a result of the sequence can thus be expressed as an integral over a suitably weighted solid angle $\theta$:

$$S(t) \propto \int_Y dy \left\{ \int_{\theta_{min}}^{\theta_{max}} \rho(y, \theta) e^{i\left[-C_y \frac{\Delta(3\cos\theta^2-1)}{2}\right]} e^{i\left[-C_y \frac{\Delta(3\cos\theta^2-1)}{2}(i-T_a/2)\right]} \sin\theta d\theta \right\}.$$

Figure 12:
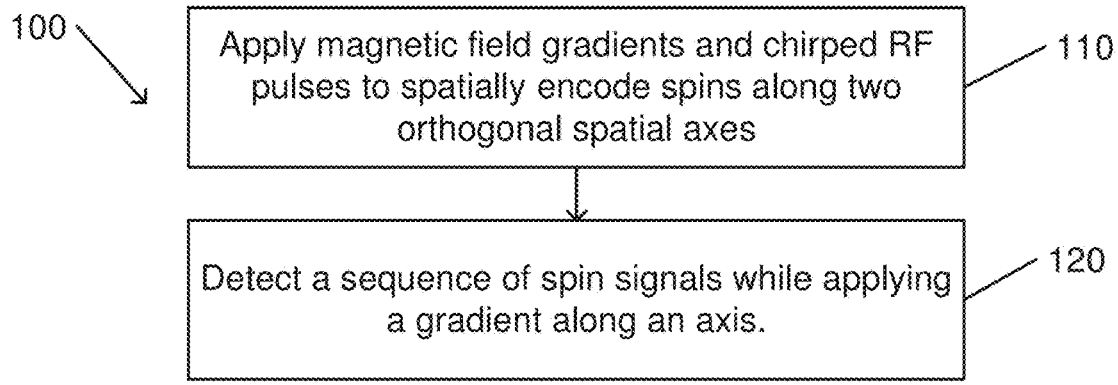
FIG. 12 is a flowchart depicting a method of xSPEN MRI, in accordance with an embodiment of the present invention.

FIG. 12 is a flowchart depicting a method of xSPEN MRI, in accordance with an embodiment of the present invention.

It should be understood with respect to any flowchart referenced herein that the division of the illustrated method into discrete operations represented by blocks of the flowchart has been selected for convenience and clarity only. Alternative division of the illustrated method into discrete operations is possible with equivalent results. Such alternative division of the illustrated method into discrete operations should be understood as representing other embodiments of the illustrated method.

Similarly, it should be understood that, unless indicated otherwise, the illustrated order of execution of the operations represented by blocks of any flowchart referenced herein has been selected for convenience and clarity only. Operations of the illustrated method may be executed in an alternative order, or concurrently, with equivalent results. Such reordering of operations of the illustrated method should be understood as representing other embodiments of the illustrated method.

Method 100 for xSPEN MRI may be executed by a processor or controller of an MRI system. Method 100 may be executed when by the processor or controller operates a control to indicate commencement of an MRI scan, or automatically under predetermined circumstances.

Magnetic field gradients may be applied concurrently with frequency-swept, or chirped, RF pulses to spatially encode spins in a subject or sample along two orthogonal axes (block 110). For example, the two orthogonal axes may be axes of a Cartesian coordinate system. For example, a first gradient pulse along a first axis (e.g., the y axis) may be applied concurrently with a first chirped RF pulse, and second gradient pulse along the first axis, with polarity opposite that of the first gradient pulse, may be applied concurrently with a second chirped RF pulse. Concurrently, a magnetic field gradient that is applied along a second, orthogonal direction (e.g., the z axis) remains constant throughout the encoding (e.g., at least from the beginning of application of the first gradient and RF pulses until the end of the second gradient and RF pulses). Prior to the spatial encoding, an appropriate RF may have been applied concurrently with a slice selecting in order to select a slice for imaging in accordance with its position within a gradient.

As a result of the spatial encoding, phases of the spins vary hyperbolically with distance from a stationary point region. As a result, only spins in the stationary point region may contribute significantly to a detectable signal.

A spin signal is measured and detected while applying a constant magnetic field gradient along an axis (block 120). The applied gradient causes the stationary point region to move along an orthogonal axis during the signal detection. As a result, signals may be detected sequentially along different positions along the orthogonal axis.

In some cases, the constant gradient that is applied during signal detection is identical to the constant gradient that is applied during encoding. In this case, an interval between the chirped pulses may be selected so as to select a FOV to be imaged.

Method 100 may be applied to acquire one-dimensional scans. Method 100 may be applied to acquire two- or three-dimensional scans by applying a combination of hybrid acquisition (as shown in FIG. 5) and application of multi-slicing techniques. In some cases, gradients may be applied along a third orthogonal axis (e.g., the x axis), to enable single shot acquisition of an image of a slice. In this case, the acquisition combines spatial encoding with encoding in inverse space along an axis that corresponds to the third orthogonal axis.

As discussed above, single shot xSPEN MRI may be advantageous over other methods of acquiring single shot MRI images.

Figure 13:
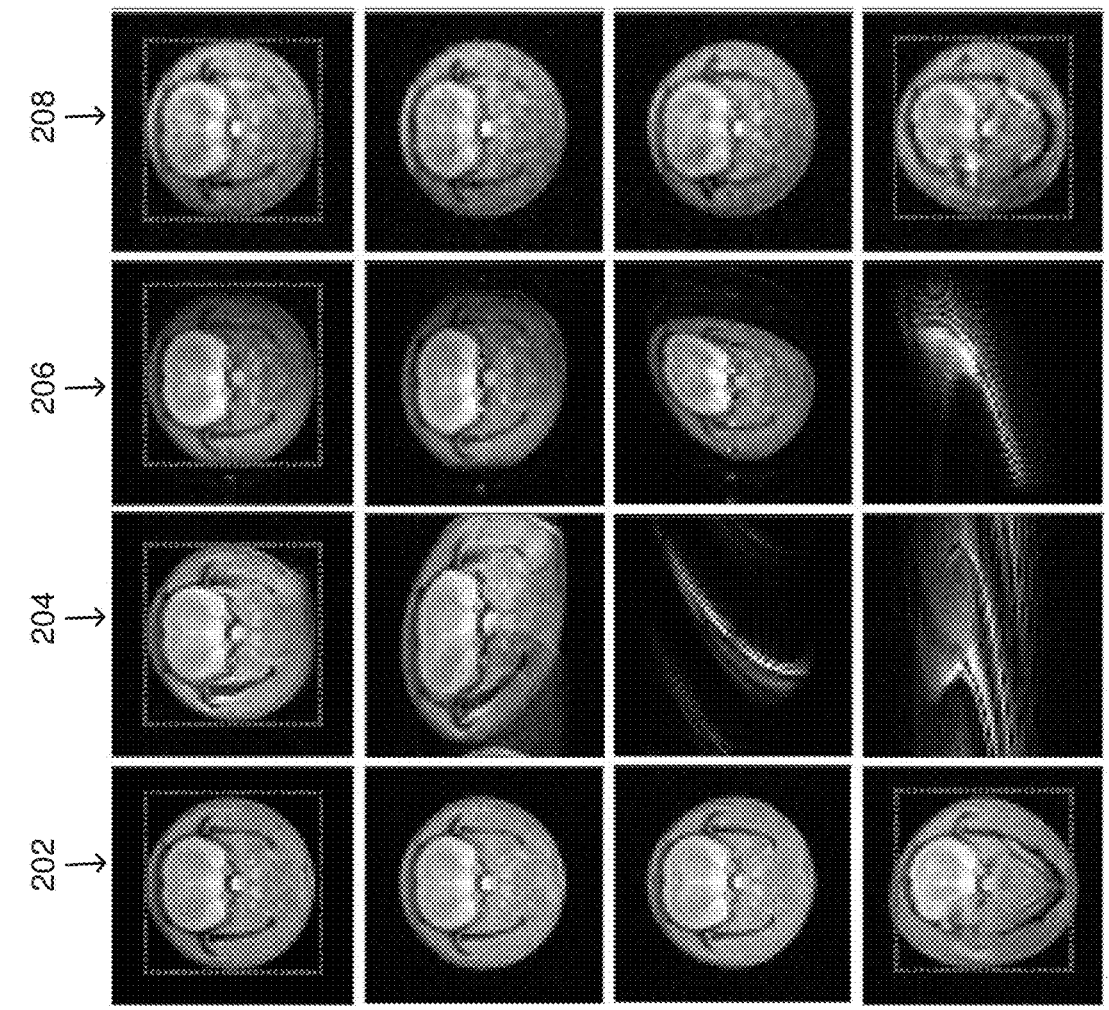
FIG. 13 compares results of application different MRI methods under conditions of varying magnetic field uniformity.
Figure 13:
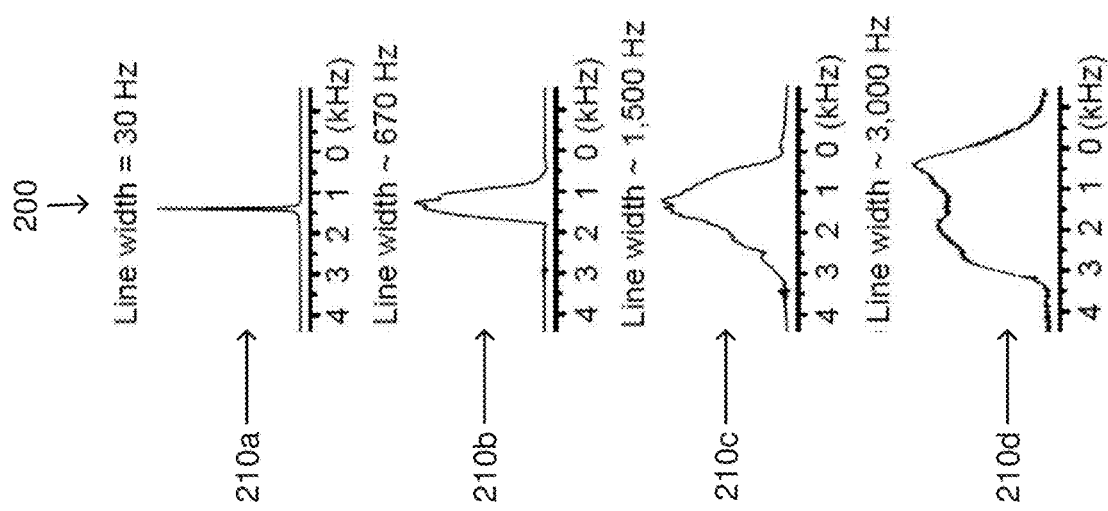

FIG. 13 compares results of application different MRI methods under conditions of varying magnetic field uniformity. The magnetic field uniformity is depicted the line-width in the proton water signal in each analyzed sample. FIG. 13 shows MRI images that were acquired of an excised brain of a rat using various MRI techniques.

Each of rows 210*a*-210*d* compares a multi-scan spin echo (SE) image 202, a single shot SE echo planar image (SE-EPI) 204, a single shot SPEN image 206, and a single shot xSPEN image 208, under conditions of field uniformity 200. Field uniformity 200 is indicated by the line-width of the water resonance.

In row 210*a*, the field is very uniform such that the water resonance approaches an ideal delta function. All of the images in row 210*a* appear to be acceptable.

In rows 210*b* to 210*d*, the field uniformity is progressively degraded, resulting in increasingly wider resonances. Multi-scan SE images 202 serve as reference images, showing little degradation. SE-EPI images 204 and SPEN images 206 are seen to degrade with increased field non-uniformity. However, single shot xSPEN images 208 are minimally degraded, and remain similar to multi-scan SE images 202.

Figure 14:
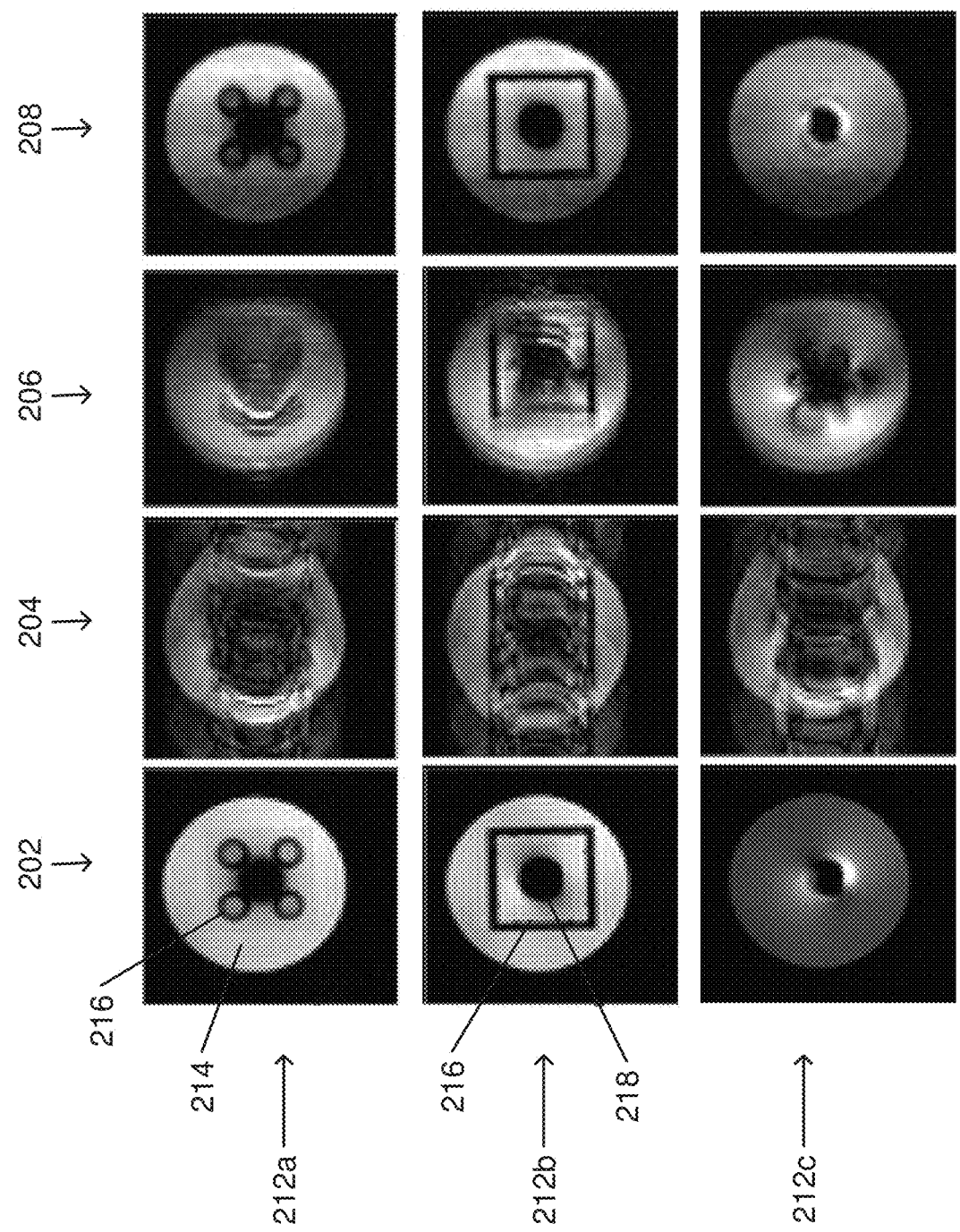
FIG. 14 compares results of application different MRI methods to a phantom designed to distort magnetic fields.

FIG. 14 compares results of application different MRI methods to a phantom designed to distort magnetic fields.

Each row 212*a*-212*c* represents a slice at a different position through the phantom.

The phantom was designed to incorporate features that are notoriously challenging to single-shot MRI acquisitions. For example, the phantom includes a titanium screw of the kind used in orthopedic implants (forming image 218), and is filled with n-propanol (with three nearly equally populated, chemically-shifted sites, forming image 214). Again, multi-scan SE images 202 are minimally distorted, due to the small values of the distortions and chemical shifts relative to the bandwidth (250 kHz) in the acquisition dimension. However, EPI images 204 and SPEN images 206 are distorted. By contrast, single shot xSPEN images 208 are, apart from sensitivity considerations related in part to their much smaller number of transients, virtually indistinguishable from multi-scan SE images 202. An entire xSPEN set of six slices (of which three are shown in FIG. 14) was acquired within 360 ms: 60 ms per slice, no delays within slices, no need for additional reference scans, and only a 2.9 kHz effective bandwidth along the xSPEN dimension.

Thus, application of xSPEN MRI may be useful in such applications as imaging organs with tissue/air interfaces or that are in motion, such as imaging the abdominal region, real-time cardiac or fetal imaging, diffusion-oriented measurements in regions close to metal implants (e.g., brain, spine), thermal measurements in the presence of magnetic transducers of the kind used in ultrasound ablation procedures, imaging organs with fatty regions (e.g., breast), and for imaging solid-like objects where intrinsic frequency distributions arising from spin anisotropies may interfere with gradients. Moreover, the capability of xSPEN to determine the FOV (zoom capability) could enable rapid scouting of organs in inhomogeneous regions or in pre-shimmed systems.

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:
1. A processor implemented method for MM imaging of a subject, the method comprising:
spatially encoding spins in a slice of the subject in a first direction and in a second direction that is orthogonal to the first direction by applying a first chirped radiofrequency (RF) pulse concurrently with application of a first magnetic field gradient pulse along the first direction, after the applying of the first RF pulse, applying a second chirped RF pulse concurrently with application of a second magnetic field gradient pulse along the first direction, the second gradient pulse having a polarity that is opposite to a polarity of the first gradient pulse, and concurrently applying an encoding magnetic field gradient along the second direction, the encoding gradient being constant at least from the beginning of the applying of the first RF pulse until the end of the applying of the second RF pulse; and following the encoding of the spins, measuring a spin signal concurrently with application of a constant readout magnetic field gradient.

2. The method of claim 1, wherein the readout gradient is applied along the second direction and the encoding gradient and the readout gradient form a single continuous gradient along the second direction.

3. The method of claim 2, wherein the second RF pulse is applied after a delay following the applying of the first RF pulse, and wherein a length of the delay is selected so as to cause the measuring of the spin signal to cover a selected field of view.

4. The method of claim 3, wherein the length of the delay is equal to half a length of a slice selection RF pulse that is applied prior to the applying of the first RF pulse plus half of a time period during which the spin signal is measured.

5. The method of claim 2, further comprising applying an oscillating magnetic field gradient concurrently with the measuring of the spin signal, and along a third direction that is orthogonal to the first direction and to the second direction.

6. The method of claim 5, further comprising applying a magnetic gradient pulse along the third direction during a delay between the applying of the first RF pulse and the applying of the second RF pulse.

7. The method of claim 2, wherein the second RF pulse is substantially identical to the first RF pulse.

8. The method of claim 2, wherein the first RF pulse or the second RF pulse is a swept $\pi/2$ or $\pi$ pulse.

9. The method of claim 1, wherein a strength of the second gradient pulse is different from the strength of the first gradient pulse.

10. The method of claim 1, further including a period during which no RF pulses or field gradients are applied between application of the first RF pulse and the second RF pulse.

11. The method of claim 1, further comprising applying, during multiple scans and between application of the first RF pulse and the second RF pulse, a variable gradient whose strength varies from scan to scan of the multiple scans.

12. The method of claim 11, further comprising periodically skipping sampling along a phase-encoding or direct readout axis in reciprocal space.

13. A magnetic resonance imaging system for imaging a subject, the system comprising:

a magnet system that is controllable to generate magnetic field gradients along a plurality of axes;

an RF system that is controllable to generate an RF pulse and to measure an RF signal; and a processor that is configured to operate in accordance with programmed instructions to execute a method that includes:

spatially encoding spins in a slice of a subject in a first direction and in a second direction that is orthogonal to the first direction by controlling the RF system to apply a first chirped radiofrequency (RF) pulse concurrently with controlling the magnet system to apply a first magnetic field gradient pulse along the first direction, after application of the first RF pulse, controlling the RF system to apply a second chirped RF pulse concurrently with controlling the magnet system to apply of a second magnetic field gradient pulse along the first direction, the second gradient pulse having a polarity that is opposite to a polarity of the first gradient pulse, and concurrently controlling the magnet system to apply an encoding magnetic field gradient along the second direction, the encoding gradient being constant at least from the beginning of the applying of the first RF pulse until the end of the applying of the second RF pulse; and following the encoding of the spins, controlling the RF system to measure a spin signal concurrently with controlling the magnet system to apply a constant readout magnetic field gradient.

14. The system of claim 13, wherein the readout gradient is applied along the second direction and the readout gradient form a single continuous gradient along the second direction.

15. The system of claim 14, wherein the second RF pulse is applied after a delay following the applying of the first RF pulse, a length of the delay being selected so as to cause the measuring of the spin signal to cover a selected field of view.

16. The system of claim 15, wherein the length of the delay is equal to half a length of a slice selection RF pulse that is applied prior to the applying of the first RF pulse plus half of a time period during which the spin signal is measured.

17. The system of claim 14, wherein processor is configured to execute a method that further comprises controlling the magnet system to apply an oscillating magnetic field gradient concurrently with the measurement of the spin signal, and along a third direction that is orthogonal to the first direction and to the second direction.

18. The system of claim 17, wherein processor is configured to execute a method that further comprises controlling the magnet system to apply a magnetic gradient pulse along the third direction during a delay between the applying of the first RF pulse and the applying of the second RF pulse.

19. The system of claim 14, wherein the second RF pulse is substantially identical to the first RF pulse.

20. The system of claim 14, wherein the first RF pulse or the second RF pulse is a swept $\pi/2$ or $\pi$ pulses.

* * * * *

UNITED STATES PATENT AND TRADEMARK OFFICE
CERTIFICATE OF CORRECTION

PATENT NO. : 10,794,980 B2
APPLICATION NO. : 15/749518
DATED : October 6, 2020
INVENTOR(S) : Lucio Frydman et al.

Page 1 of 1

It is certified that error appears in the above-identified patent and that said Letters Patent is hereby corrected as shown below:

In the Claims

Column 22, Line 63, MM is replaced with MRI in Claim 1.

Signed and Sealed this
Twenty-fourth Day of December, 2024

Derrick Brent
*Acting Director of the United States Patent and Trademark Office*